United States Patent
Zeng et al.

(10) Patent No.: US 10,447,300 B2
(45) Date of Patent: Oct. 15, 2019

(54) DECODING DEVICE, DECODING METHOD, AND SIGNAL TRANSMISSION SYSTEM

(71) Applicant: HUAWEI TECHNOLOGIES CO., LTD., Shenzhen, Guangdong (CN)

(72) Inventors: Yanxing Zeng, Hangzhou (CN); Jianqiang Shen, Hangzhou (CN); Yufeng Mao, Hangzhou (CN); Marc Fossorier, Cruseilles (FR)

(73) Assignee: HAUWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/951,182

(22) Filed: Apr. 12, 2018

(65) Prior Publication Data

US 2018/0234113 A1  Aug. 16, 2018

Related U.S. Application Data

(63) Continuation of application No. PCT/CN2015/097284, filed on Dec. 14, 2015.

(30) Foreign Application Priority Data

Oct. 13, 2015 (WO) ................ PCT/CN2015/091887

(51) Int. Cl.
  *H03M 13/00* (2006.01)
  *H03M 13/11* (2006.01)
  *H03M 13/25* (2006.01)

(52) U.S. Cl.
  CPC ...... *H03M 13/1105* (2013.01); *H03M 13/114* (2013.01); *H03M 13/1117* (2013.01);
  (Continued)

(58) Field of Classification Search
  CPC .......... H03M 13/1105; H03M 13/1117; H03M 13/1131; H03M 13/114
  See application file for complete search history.

(56) References Cited

U.S. PATENT DOCUMENTS 5,852,469 A * 12/1998 Nagai .................. H03M 7/40
                                                         375/240.23
6,240,538 B1 * 5/2001 Dent .................. H03M 13/154
                                                         714/762
(Continued)

FOREIGN PATENT DOCUMENTS

CN  1852029 A  10/2006
CN  1996764 A   7/2007
(Continued)

OTHER PUBLICATIONS

Marc Fossorier et al., Clipping for Quantized Corrected Min-Sum Decoding of LDPC Codes. Working draft, Nov. 2014, 9 pages.
(Continued)

*Primary Examiner* — Esaw T Abraham
(74) *Attorney, Agent, or Firm* — Huawei Technologies Co., Ltd.

(57) ABSTRACT

Embodiments of the present application provide a decoding method and a decoding device. The decoding device receives a second code word, which is transmitted from an encoding device based on a first code word. The first code word is generated by the encoding device based on a first encoded data sequence. After determining that a second encoded data sequence based on the second code word is not a correct replica of the first encoded data sequence, the decoding device performs a series of code element update processes to determining the correct replica of the first encoded data sequence.

18 Claims, 8 Drawing Sheets

(52) U.S. Cl.
CPC .... *H03M 13/1131* (2013.01); *H03M 13/1157* (2013.01); *H03M 13/255* (2013.01); *H03M 13/616* (2013.01); *H03M 13/6591* (2013.01); *H03M 13/1128* (2013.01)

(56) References Cited

U.S. PATENT DOCUMENTS

| | | | |
|---|---|---|---|
| 7,103,554 B1* | 9/2006 | Sperschneider | H03M 7/42 |
| | | | 348/415.1 |
| 7,129,862 B1* | 10/2006 | Shirdhonkar | H03M 7/40 |
| | | | 341/67 |
| 7,218,254 B2* | 5/2007 | Kahlman | G11B 20/1426 |
| | | | 341/50 |
| 7,657,820 B2 | 2/2010 | Yokokawa et al. | |
| 7,774,689 B2* | 8/2010 | Chiu | H03M 13/1197 |
| | | | 714/752 |
| 8,313,029 B2* | 11/2012 | Thiyagarajah | G06K 7/1456 |
| | | | 235/462.01 |
| 8,350,735 B2* | 1/2013 | Hallapuro | H03M 7/42 |
| | | | 341/67 |
| 8,442,021 B2* | 5/2013 | Krishnamurthy | H04W 24/02 |
| | | | 370/342 |
| 8,713,411 B2* | 4/2014 | Kong | G06F 11/1072 |
| | | | 714/774 |
| 8,972,817 B2 | 3/2015 | Ngatched Nkouatchah et al. | |
| 8,976,774 B2* | 3/2015 | Krishnamurthy | H04W 24/02 |
| | | | 370/342 |
| 2003/0023917 A1 | 1/2003 | Richardson et al. | |
| 2004/0034828 A1 | 2/2004 | Hocevar | |
| 2004/0123228 A1 | 6/2004 | Kikuchi et al. | |
| 2006/0026486 A1 | 2/2006 | Richardson et al. | |
| 2006/0242536 A1 | 10/2006 | Yokokawa et al. | |
| 2006/0294446 A1 | 12/2006 | Chun et al. | |
| 2007/0210941 A1 | 9/2007 | Park et al. | |
| 2008/0086671 A1 | 4/2008 | Garg et al. | |
| 2008/0163027 A1 | 7/2008 | Richardson et al. | |
| 2009/0187802 A1 | 7/2009 | Yamagishi | |
| 2009/0217128 A1 | 8/2009 | Xin | |
| 2009/0327832 A1 | 12/2009 | Ichihara | |
| 2010/0306616 A1 | 12/2010 | Kishimoto et al. | |
| 2011/0078548 A1 | 3/2011 | Xin | |
| 2013/0055043 A1 | 2/2013 | Ngatched et al. | |
| 2013/0061114 A1 | 3/2013 | Malmirchegini et al. | |
| 2015/0143194 A1 | 5/2015 | Nemati Anaraki et al. | |

FOREIGN PATENT DOCUMENTS

| | | |
|---|---|---|
| CN | 101064591 A | 10/2007 |
| CN | 101208893 A | 6/2008 |
| CN | 101854179 A | 10/2010 |
| CN | 102164023 A | 8/2011 |
| CN | 102545913 A | 7/2012 |
| CN | 102957436 A | 3/2013 |
| CN | 101807928 B | 6/2013 |
| JP | 3815557 B2 | 8/2006 |
| JP | 2010009719 A | 1/2010 |
| JP | 2010278912 A | 12/2010 |
| JP | 5556570 B2 | 7/2014 |
| KR | 20070058477 A | 6/2007 |
| KR | 20100110662 A | 10/2010 |
| RU | 2395902 C2 | 7/2010 |
| TW | 569548 B | 1/2004 |
| WO | 2015099331 A1 | 7/2015 |

OTHER PUBLICATIONS

Yao Y. et al., Memory Efficient LDPC Decoder Design. in Proceedings. of IEEEPrimeAsia"11, Oct. 7, 2011, pp. 127-130.

N. Kanistras et al. ,Impact of LLR saturation and quantization on LDPC min-sum decoders ,Signal Processing Systems (Sips), 2010 IEEE Workshop on ,Oct. 8, 2010, 7 pages.

Byung Jun Choi et al:"Simplified forced convergence decoding algorithm for low power LDPC decoders",Proc., IEEE Asia Pacific Conference on Circuits and Systems (APCCAS),Nov. 17, 2014-Nov. 20, 2014, XP055443186,4 pages.

Kim S. et al., Adaptive Quantization in Min-sum based Irregular LDPCDecoder. in Proceedings of IEEE ISCAS"08, May 21, 2008, pp. 536-539.

Ming-Qiu Wang et al. ,A quantization schema with negligible degradation for LDPC decoder,Wireless Communications, Networking and Information Security (WCNIS), 2010 IEEE International Confer,Jun. 27, 2010, 6 pages.

Ernesto Zimmermann et al:"Forced convergence decoding of LDPC Codes—Exit chart anaylsis and combination with node complexity reduction techniques",Next generation wireless and mobile communications and services: European Wireless 2005—11th European Wireless Conference 2005,Nicosia,Cyprus,Apr. 10-13, 2005; proceedings, Apr. 10, 2005,XP055443717, 8 pages.

Cha-Hao Chung et al. ,Adaptive Quantization for Low-Density-Parity-Check Decoders,ISITA 2010,Oct. 20, 2010, 6 pages.

Ernesto Zimmermann et al., "Forced convergence decoding of LDPC Codes—Exit chart analysis and combination with node complexity reduction techniques",Next generation wireless and mobile communications and services: European Wireless 2005—11th European Wireless Conference 2005,Nicosia,Cyprus,Apr. 10-13, 2005; proceedings, Apr. 10, 2005,XP055443717, 8 pages.

* cited by examiner

DECODING DEVICE, DECODING METHOD, AND SIGNAL TRANSMISSION SYSTEM

CROSS-REFERENCE TO RELATED APPLICATIONS

This application is a continuation of International Application No. PCT/CN2015/097284, filed on Dec. 14, 2015, which claims priority to International Application No. PCT/CN2015/091887, filed on Oct. 13, 2015. The disclosures of the aforementioned applications are hereby incorporated by reference in their entireties.

TECHNICAL FIELD

The present application relates to the field of data processing technologies, and in particular, to a decoding device and a decoding method for decoding a low-density parity-check (LDPC) code. Further, the present application relates to a signal transmission system and a data storage system that use LDPC codes.

BACKGROUND

Low-density parity-check (LDPC) code was first proposed by Gallager in 1963. It is a linear block code including information bits and parity bits. For a LDPC code having a code length of n, a assuming a size (a length) of the information bits is k, a size of the parity bits is n−k. A ratio R=k/n is called a code rate. An LDPC code encoding device processes a to-be-transmitted signal according to a generator matrix (also referred to as a G matrix) to generate a code word. Generally, some code elements of this code word include the to-be-transmitted signal and are also referred to as information bits, and some code elements include parity bits used for check. Subsequently, the LDPC code encoding device sends the code word to an LDPC code decoding device through a communications channel. Then, the LDPC code decoding device decodes the code word. In decoding the code word, the decoding devices, verifies whether the code word passes check decision. When an error occurs because the code word is interfered by noise in a process of transmission through the communications channel, the code word would fail to pass the check decision. The LDPC code decoding device needs to perform an iterative update on the code word by using a check matrix H, until an updated code word can pass the decision.

In a storage controller, generally a logic circuit, a chip or the like is used to implement an LDPC code decoding device. In specific implementations, data internally processed by the decoding device is quantized, calculated, and stored, and the quantization process may cause a decrease in an error correction capability of the LDPC code decoding device.

SUMMARY

The present application provides a decoding device, where the decoding device can perform processing in a case in which a code element quantization range is exceeded in a code element update process and improve an LDPC code error correction capability of the decoding device.

According to an aspect, an embodiment of the present application provides a decoding device, where the decoding device is configured to decode an LDPC code. The decoding device includes an acquiring unit, configured to acquire a first code word, for example, −9, +7, −12, +4, +7, +10, −11. The first code word is generated by an LDPC code encoding device according to a generator matrix and includes M first code elements, M is a positive integer and M in the previous example is 7. The decoding device further includes a processing unit, configured to acquire P first code elements corresponding to the $n^{th}$ row of a check matrix, where for example, when n is set to 1, three elements on the first row of the check matrix are 1, and therefore, P is 3; acquire P first update values corresponding to the P first code elements; obtain, according to the P first update values, P second update values corresponding to the P first code elements; determine whether each second update value of the P second update values exceeds a code element quantization range; keep the $a^{th}$ first code element not updated when the $a^{th}$ second update value of the P second update values exceeds the code element quantization range; update the $b^{th}$ first code element by using the $b^{th}$ second update value when the $b^{th}$ second update value of the P second update values does not exceed the code element quantization range; obtain, according to the foregoing update operation, P second code elements corresponding to the $n^{th}$ row of the check matrix; and generate a second code word according to the P second code elements corresponding to the $n^{th}$ row of the check matrix, where the check matrix corresponds to the generator matrix and includes N rows, $1 \le n \le N$, $P \le M$, $1 \le a \le P$, $1 \le b \le P$, and each second update value is a sum of each first update value and a corresponding first code element; and a determining unit, configured to acquire the second code word and determine whether the second code word is decoded successfully. After acquiring the to-be-decoded first code word, the decoding device needs to perform, on the first code word, processing corresponding to the $n^{th}$ row of the check matrix, may update a code element in the first code word in the processing process, and if an updated code element exceeds the code element quantization range, needs to abandon this update. That is, in this aspect, if an update corresponding to a code element exceeds the code element quantization range, the update corresponding to the code element is abandoned.

Optionally, in this aspect, the determining whether each second update value of the P second update values exceeds a code element quantization range may be concurrently determining whether each second update value of the P second update values exceeds the code element quantization range, or may be sequentially determining, from left to right according to a sequence of the P first code elements corresponding to the $n^{th}$ row of the check matrix, whether each second update value of the P second update values exceeds the code element quantization range.

Optionally, the decoding device in this aspect is implemented by a circuit, and the acquiring unit, the processing unit, and the determining unit that are included in the decoding device are also implemented by a circuit.

Optionally, in this aspect, the generating a second code word according to the P second code elements corresponding to the $n^{th}$ row of the check matrix includes: generating the second code word according to the P second code elements corresponding to the $n^{th}$ row of the check matrix and another first code element that is in the first code word and unrelated to the $n^{th}$ row of the check matrix.

Optionally, in this aspect, the generating a second code word according to the P second code elements corresponding to the $n^{th}$ row of the check matrix includes: generating the second code word according to P second code elements corresponding to each row of the check matrix.

In a possible design, the processing unit mentioned above includes a storage module. The storage module is configured to store the P first code elements, and is further configured to store the P second update values; the processing unit reads, when determining that the $a^{th}$ second update value of the P second update values exceeds the code element quantization range, the $a^{th}$ first code element stored in the storage module; and the processing unit reads, when determining that the $b^{th}$ second update value of the P second update values does not exceed the code element quantization range, the $b^{th}$ second update value stored in the storage module, so as to update the $b^{th}$ first code element. If the foregoing case occurs in which an updated code element exceeds the code element quantization range, a code element before the update needs to be read to abandon this update. Therefore, the storage module is configured to store the P second update values and the P first code elements, so as to implement that a needed value can be acquired from the storage module no matter whether the updated code element exceeds the code element quantization range, and ensure that the decoding device can flexibly respond to a case in which a second update value exceeds or does not exceed the code element quantization range in a decoding process.

According to another aspect, an embodiment of the present application provides a decoding device, where the decoding device is configured to decode an LDPC code. The decoding device includes: an acquiring unit, configured to acquire a first code word, for example, −9, +7, −12, +4, +7, +10, −11, where the first code word is generated by an LDPC code encoding device according to a generator matrix and includes M first code elements, M is a positive integer and M in the previous example is 7; a processing unit, configured to acquire P first code elements corresponding to the $n^{th}$ row of a check matrix, where for example, when three elements on the first row of the check matrix are 1, P is 3; acquire P first update values corresponding to the P first code elements; obtain, according to the P first update values, P second update values corresponding to the P first code elements; determine whether each second update value of the P second update values exceeds a code element quantization range; keep the P first code elements not updated when the $a^{th}$ second update value of the P second update values exceeds the code element quantization range; update the P first code elements by using the P second update values when each second update value of the P second update values does not exceed the code element quantization range; obtain, according to the foregoing update operation, P second code elements corresponding to the $n^{th}$ row of the check matrix; and generate a second code word according to the P second code elements, where the check matrix corresponds to the generator matrix and includes N rows, $1 \leq n \leq N$, $P \leq M$, $1 \leq a \leq P$, $1 \leq b \leq P$, each second update value is a sum of each first update value and a corresponding first code element, and the P second code elements includes at least one of the P first code elements; and a determining unit, configured to acquire the second code word and determine whether the second code word is decoded successfully. After acquiring the to-be-decoded first code word, the decoding device needs to perform, on the code word, processing corresponding to the $n^{th}$ row of the check matrix, and may update a code element in the first code word in the processing process. That is, in this aspect, if an update corresponding to a code element exceeds the code element quantization range, updates corresponding to the P first code elements by using all P second update values corresponding to this row of the check matrix are abandoned.

Optionally, in this aspect, the determining whether each second update value of the P second update values exceeds a code element quantization range may be concurrently determining whether each second update value of the P second update values exceeds the code element quantization range, or may be sequentially determining, from left to right according to a sequence of the P first code elements corresponding to the $n^{th}$ row of the check matrix, whether each second update value of the P second update values exceeds the code element quantization range.

Optionally, the decoding device in this aspect is implemented by a circuit, and the acquiring unit, the processing unit, and the determining unit that are included in the decoding device are also implemented by a circuit.

Optionally, in this aspect, the generating a second code word according to the P second code elements corresponding to the $n^{th}$ row of the check matrix includes: generating the second code word according to the P second code elements corresponding to the $n^{th}$ row of the check matrix and another first code element that is in the first code word and unrelated to the $n^{th}$ row of the check matrix.

Optionally, in this aspect, the generating a second code word according to the P second code elements corresponding to the $n^{th}$ row of the check matrix includes: generating the second code word according to P second code elements corresponding to each row of the check matrix.

In a possible design, the processing unit mentioned above includes a storage module; the storage module is configured to store the P first code elements, and is further configured to store the P second update values; the processing unit reads, when determining that the $a^{th}$ second update value of the P second update values exceeds the code element quantization range, the P first code elements stored in the storage module; and the processing unit reads, when determining that each second update value of the P second update values does not exceed the code element quantization range, the P second update values stored in the storage module, so as to update the P first code elements. If the foregoing case occurs in which an updated code element exceeds the code element quantization range, all P first code elements before the update need to be read to abandon this update. Therefore, the storage module is configured to store the P second update values and the P first code elements, so as to implement that a needed value can be acquired from the storage module no matter whether the updated code element exceeds the code element quantization range, and ensure that the decoding device can flexibly respond to a case in which a second update value exceeds or does not exceed the code element quantization range in a decoding process.

According to another aspect, an embodiment of the present application provides a decoding method, where the decoding method is used to decode an LDPC code and includes: acquiring a first code word, for example, −9, +7, −12, +4, +7, +10, −11, where the first code word is generated by an LDPC code encoding device according to a generator matrix and includes M first code elements, M is a positive integer and M in the previous example is 3; acquiring P first code elements corresponding to the $n^{th}$ row of a check matrix, where for example, when three elements on the first row of the check matrix are 1, P is 3; acquiring P first update values corresponding to the P first code elements; obtaining, according to the P first update values, P second update values corresponding to the P first code elements; determining whether each second update value of the P second update values exceeds a code element quantization range; keeping the $a^{th}$ first code element not updated when the $a^{th}$ second update value of the P second update values exceeds the code element quantization range; updating the $b^{th}$ first code element by using the $b^{th}$ second update value when the $b^{th}$ second update value of the P second update values does not exceed the code element quantization range; obtaining, according to the foregoing update operation, P second code elements corresponding to the $n^{th}$ row of the check matrix; and generating a second code word according to the P second code elements corresponding to the $n^{th}$ row of the check matrix, where the check matrix corresponds to the generator matrix and includes N rows, $1 \leq n \leq N$, $P \leq M$, $1 \leq a \leq P$, $1 \leq b \leq P$, and each second update value is a sum of each first update value and a corresponding first code element; and determining whether the second code word is decoded successfully. In the decoding process, after the to-be-decoded first code word is acquired, processing corresponding to the $n^{th}$ row of the check matrix needs to be performed on the first code word, a code element in the first code word may be updated in the processing process, and if an updated code element exceeds the code element quantization range, this update needs to be abandoned. That is, in this aspect, if an update corresponding to a code element exceeds the code element quantization range, the update corresponding to the code element is abandoned.

Optionally, in this aspect, the determining whether each second update value of the P second update values exceeds a code element quantization range may be concurrently determining whether each second update value of the P second update values exceeds the code element quantization range, or may be sequentially determining, from left to right according to a sequence of the P first code elements corresponding to the $n^{th}$ row of the check matrix, whether each second update value of the P second update values exceeds the code element quantization range.

Optionally, in this aspect, the generating a second code word according to the P second code elements corresponding to the $n^{th}$ row of the check matrix includes: generating the second code word according to the P second code elements corresponding to the $n^{th}$ row of the check matrix and another first code element that is in the first code word and unrelated to the $n^{th}$ row of the check matrix.

Optionally, in this aspect, the generating a second code word according to the P second code elements corresponding to the $n^{th}$ row of the check matrix includes: generating the second code word according to P second code elements corresponding to each row of the check matrix.

According to another aspect, an embodiment of the present application provides a decoding method, where the decoding method is used to decode an LDPC code and includes: acquiring a first code word, for example, −9, +7, −12, +4, +7, +10, −11, where the first code word is generated by an LDPC code encoding device according to a generator matrix and includes M first code elements, M is a positive integer and M in the previous example is 7; acquiring P first code elements corresponding to the $n^{th}$ row of a check matrix, where for example, when three elements on the first row of the check matrix are 1, P is 3; acquiring P first update values corresponding to the P first code elements; obtaining, according to the P first update values, P second update values corresponding to the P first code elements; determining whether each second update value of the P second update values exceeds a code element quantization range; keeping the P first code elements not updated when the $a^{th}$ second update value of the P second update values exceeds the code element quantization range; updating the P first code elements by using the P second update values when each second update value of the P second update values does not exceed the code element quantization range; obtaining, according to the foregoing update operation, P second code elements corresponding to the $n^{th}$ row of the check matrix; and generating a second code word according to the P second code elements, where the check matrix corresponds to the generator matrix and includes N rows, $1 \leq n \leq N$, $P \leq M$, $1 \leq a \leq P$, $1 \leq b \leq P$, and each second update value is a sum of each first update value and a corresponding first code element; and determining whether the second code word is decoded successfully. In the decoding process, after the to-be-decoded first code word is acquired, processing corresponding to the $n^{th}$ row of the check matrix needs to be performed on the code word, a code element in the first code word may be updated in the processing process. That is, in this aspect, if an update corresponding to a code element exceeds the code element quantization range, updates corresponding to the P first code elements by using all P second update values corresponding to this row of the check matrix are abandoned.

Optionally, in this aspect, the determining whether each second update value of the P second update values exceeds a code element quantization range may be concurrently determining whether each second update value of the P second update values exceeds the code element quantization range, or may be sequentially determining, from left to right according to a sequence of the P first code elements corresponding to the $n^{th}$ row of the check matrix, whether each second update value of the P second update values exceeds the code element quantization range.

Optionally, in this aspect, the generating a second code word according to the P second code elements corresponding to the $n^{th}$ row of the check matrix includes: generating the second code word according to the P second code elements corresponding to the $n^{th}$ row of the check matrix and another first code element that is in the first code word and unrelated to the $n^{th}$ row of the check matrix.

Optionally, in this aspect, the generating a second code word according to the P second code elements corresponding to the $n^{th}$ row of the check matrix includes: generating the second code word according to P second code elements corresponding to each row of the check matrix.

According to another aspect, an embodiment of the present application provides a signal transmission system, including an LDPC code encoding device and the decoding device mentioned in any one of the foregoing aspects, where the LDPC code encoding device is configured to generate a first code word according to a generator matrix and transmit the first code word to the decoding device through a communications channel. In a process of using the signal transmission system, impact of noise on a to-be-transmitted signal during transmission in the communications channel is taken into account, and therefore, the LDPC code encoding device is used to encode the to-be-transmitted signal into an LDPC code, and the LDPC code is decoded on the decoding device side, so as to ensure that a decoding result of the decoding device includes the original to-be-transmitted signal. In this signal transmission system, the decoding device mentioned in any one of the foregoing aspects is used, which improves accuracy of the decoding device in decoding an LDPC code and also improves reliability of a signal transmitted in the signal transmission system.

According to another aspect, an embodiment of the present application provides a data storage system, including an LDPC code encoding device, the decoding device mentioned in any one of the foregoing aspects and a storage medium, where the LDPC code encoding device is configured to generate a first code word according to a generator matrix and store the first code word in the storage medium, and the decoding device is configured to acquire the first code word from the storage medium. In a process of using the data storage system, a signal change caused when a to-be-stored signal is stored in the storage medium for an excessively long period or affected by another factor is taken into account, and therefore, the LDPC code encoding device is used to encode the to-be-stored signal into an LDPC code and then store the LDPC code in the storage medium, the LDPC code is read and decoded on the decoding device side, so as to ensure that a decoding result of the decoding device includes the original to-be-stored signal. In this data storage system, the decoding device mentioned in any one of the foregoing aspects is used, which improves accuracy of the decoding device in decoding an LDPC code and also improves reliability of a signal stored in the data storage system.

In comparison with the prior art, in a code word update process in solutions provided in the present application, a decoding device performs processing in a case in which a value of an updated code element exceeds a code element quantization range, which prevents the decoding device from directly quantizing the updated code element that exceeds the code element quantization range, and improves an error correction capability of the decoding device in a decoding process.

BRIEF DESCRIPTION OF DRAWINGS

The following briefly introduces the accompanying drawings used in describing the embodiments.

DESCRIPTION OF EMBODIMENTS

The following describes the technical solutions in the embodiments of the present application with reference to the accompanying drawings.

Throughout this specification, the term "low-density parity-check (LDPC) code" refers to a type of linear error-correctable code that is usually used in the communications field for transmitting a signal through a communications channel, or for storing data in a storage medium.

Throughout this specification, the term "code word" refers to a signal composed by a group of code elements. The group of code elements is transmitted through a communications channel or stored in a storage device. For example, if a LDPC code word has a length of 7, the code word includes 7 code elements.

Throughout this specification, the term "quantization range of code element" may also be referred to as "quantization range of variable node." In a LDPC code decoding process, each code element of a to-be-decoded code corresponds to one variable node, and each row of a check matrix corresponds to one check node. For details, refer to a Tanner diagram in FIG. 6. A code element quantization range is a size of address space allocated by an LDPC code decoding device to each code element. For example, if address space allocated to each code element is 6 bits, a code element quantization range is from −31 to +31 (herein after including −31 and +31).

Figure 1:
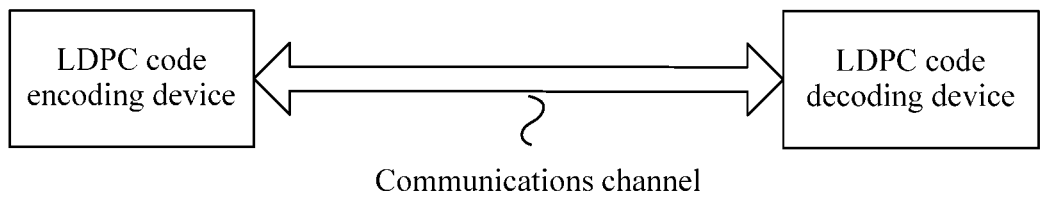
FIG. 1 is a schematic diagram of an LDPC code encoding and decoding architecture according to an embodiment of the present application.

LDPC Code Encoding and Decoding Architecture in Embodiments of the Present Application FIG. 1 depicts an LDPC code encoding and decoding architecture according to an embodiment of the present application. Generally, for a group of to-be-transmitted signals (carrying actual information, also referred to as information bits), an LDPC code encoding device first generates one code word for the to-be-transmitted signals according to a generator matrix. The generator matrix is also referred to as a G matrix. Then, the LDPC code encoding device sends the code word to an LDPC code decoding device through a communications channel. Because the code word may be affected by noise in a process of transmission through the communications channel to cause an error in the code word the LDPC code decoding device is equipped with an error correction and checking capability for the code word transmitted through the communications channel. For example, a group of to-be-transmitted signals is 1, 0, 1, 1. A code word generated by the LDPC code encoding device according to the generator matrix is 1, 0, 1, 1, 0, 0, 1. After the LDPC code encoding device transmits the code word to the LDPC code decoding device by using electric potential signals, the electric potential signals received by the LDPC code decoding device are −9 volt, +7 volt, −12 volt, +4 volt, +7 volt, +10 volt, −11 volt. In the present application, the electric potential signal sent to the LDPC code decoding device through a communications channel is also referred to as a code word, where a positive potential corresponds to 0 and a negative potential corresponds to 1. Therefore, after being transmitted through the communications channel, the fourth code element 1 turns into +4 volt corresponding to 0, that is, an error occurs in a process of transmitting the fourth code element of the code word through the communications channel. The LDPC code decoding device needs to correct the error according to a check matrix corresponding to the generator matrix used by the LDPC code encoding device, so as to acquire the correct code word 1, 0, 1, 1, 0, 0, 1.

Figure 2:
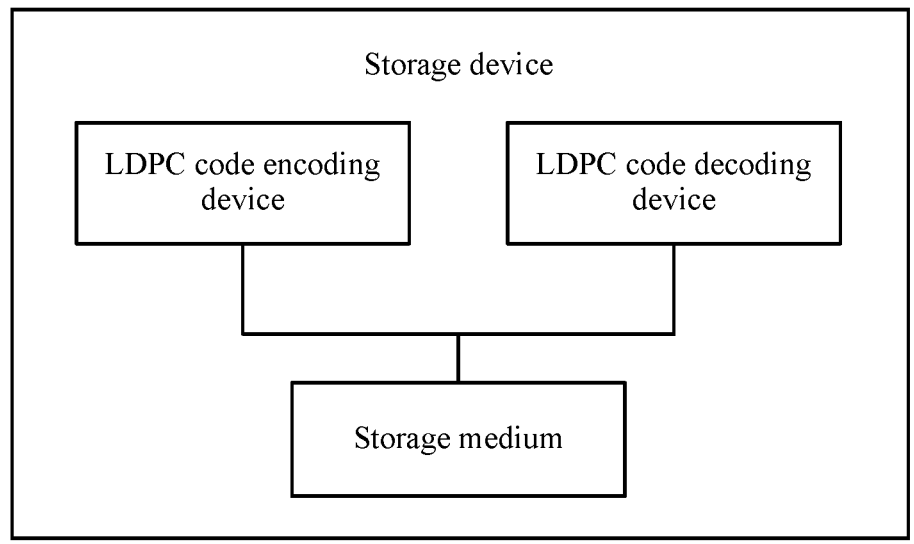
FIG. 2 is a schematic diagram of another LDPC code encoding and decoding architecture according to an embodiment of the present application.

FIG. 2 depicts a use scenario of another LDPC code encoding and decoding architecture according to an embodiment of the present application. According to the foregoing example, after receiving to-be-stored signals 1, 0, 1, 1, the LDPC code encoding device generates a code word 1, 0, 1, 1, 0, 0, 1 according to the to-be-stored signals and a generator matrix, and stores the code word in a storage medium. When the LDPC code decoding device accesses the storage medium, the storage medium usually records data by using an electric potential signal. For example, electric potential signals acquired from the storage medium by the LDPC code decoding device are −9 volt, +7 volt, −12 volt, +4 volt, +7 volt, +10 volt, −11 volt. Due to aging or other factors of the storage medium, an error occurs in the fourth code element in a storage process. The LDPC code decoding device needs to correct the error according to a check matrix corresponding to the generator matrix used by the LDPC code encoding device, so as to acquire the correct code word 1, 0, 1, 1, 0, 0, 1.

In practice, generally, the LDPC code encoding device and the LDPC code decoding device perform tasks by using a dedicated hardware device, for example, an application-specific integrated circuit (ASIC), a field programmable gate array (FPGA), or the like. An electric potential signal transmitted to the LDPC code decoding device through the communications channel is usually a floating point number. In addition, due to existence of noise, a value range of the electric potential signal cannot be determined. Therefore, generally, in design, the LDPC code decoding device quantizes potential values of a code word that is acquired by the LDPC code decoding device or used in an error correction process. For example, when 6 bits are used for quantization, a value range is −31 to +31, a value greater than +31 is set to +31, and a value less than −31 is set to −31. There are multiple quantization methods in practice and a quantization result is not necessarily an integer, but may also include an integer part and a fractional part. However, according to a quantity of bits of an allocated quantization value in design, the quantization result has a fixed value range, also referred to as a quantization range. Generally, a variable node and a check node each have their respective quantization ranges. In this document of the present application, a code element quantization range is also a variable node quantization range.

Device Embodiment 1

Figure 3:
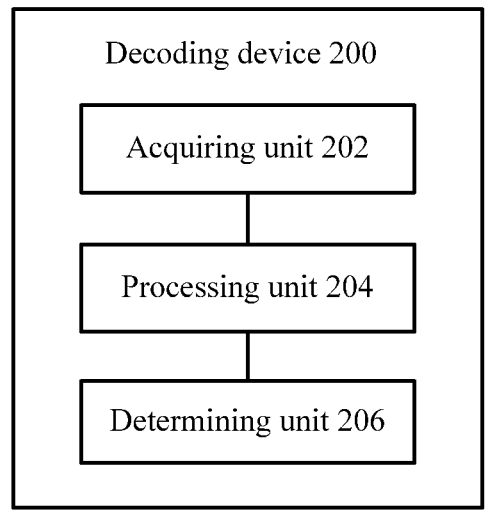
FIG. 3 is a block diagram of a decoding device according to device embodiment 1 of the present application.

Device embodiment 1 provides a decoding device 200, where the decoding device 200 is configured to decode an LDPC code. FIG. 3 shows a block diagram of the decoding device 200. The device 200 includes an acquiring unit 202, a processing unit 204, and a determining unit 206.

The acquiring unit 202 is configured to acquire a first code word, where the first code word is generated by an LDPC code encoding device according to a generator matrix and includes M first code elements and M is a positive integer. For details, refer to the LDPC code encoding and decoding architecture mentioned above. The code word acquired by the acquiring unit 202 may be transmitted through a communications channel, or may be read from a storage medium. The first code element herein is any code element in the first code word.

The processing unit 204 is configured to acquire P first code elements corresponding to the $n^{th}$ row of a check matrix; acquire P first update values corresponding to the P first code elements; obtain, according to the P first update values, P second update values corresponding to the P first code elements; sequentially determine whether each second update value of the P second update values exceeds a code element quantization range; keep the $a^{th}$ first code element not updated when the $a^{th}$ second update value of the P second update values exceeds the code element quantization range; update the $b^{th}$ first code element by using the $b^{th}$ second update value when the $b^{th}$ second update value of the P second update values does not exceed the code element quantization range; obtain, according to the foregoing update operation, P second code elements corresponding to the $n^{th}$ row of the check matrix; and generate a second code word according to the P second code elements corresponding to the $n^{th}$ row of the check matrix. The check matrix corresponds to the generator matrix and includes N rows, $1 \leq n \leq N$, $P \leq M$, $1 \leq a \leq P$, $1 \leq b \leq P$, and each second update value is a sum of each first update value and a corresponding first code element.

The determining unit 206 is configured to acquire the second code word generated by the determining processing unit 204 and determine whether the second code word is decoded successfully.

$$\begin{vmatrix} 1 & 1 & 0 & 1 & 0 & 0 & 0 \\ 0 & 0 & 1 & 1 & 1 & 0 & 0 \\ 0 & 0 & 0 & 1 & 0 & 1 & 1 \end{vmatrix}$$

In this embodiment, for example, the foregoing check matrix is used by the decoding device, that is, N is equal to 3, and the first code word acquired by the acquiring unit 202 is −9, +7, −12, +4, +7, +10, −11, that is, M is equal to 7. The processing unit 204 generates, according to a code element that is in the first code word and related to the first row of the check matrix, an update value that is corresponding to the code element that is in the code word and related to the first row of the check matrix, that is, n is equal to 1. It should be noted that, during actual operation, the processing unit 204 may perform processing according to a sequence from the first row, the second row, to the third row of the check matrix, or may perform processing according to another sequence. A value of n herein may be any positive integer less than or equal to a quantity of rows of the check matrix. After acquiring code elements related to the first row of the check matrix, namely, the $1^{st}$ code element −9, the $2^{nd}$ code element +7, and the $4^{th}$ code element +4, where the first code elements include −9, +7, and +4, the processing unit 204 generates an update value +4 corresponding to the $1^{st}$ code element in the first code word, an update value −4 corresponding to the $2^{nd}$ code element, and an update value −7 corresponding to the $4^{th}$ code element, that is, P is equal to 3, and the first update values include +4, −4, and −7. A symbol of a first update value corresponding to each first code element of the P first code elements is a product of symbols of other first code elements except this first code element, and an absolute value of the first update value corresponding to each first code element of the P first code elements is an absolute value of a first code element with a smallest absolute value (if this first code element itself is the first code element with the smallest absolute value, the absolute value of the first update value corresponding to this first code element is set to an absolute value of a first code element with a second smallest absolute value). For example, if first code elements include a code element A, a code element B, and a code element C, a symbol of an update value corresponding to the code element A is a product of symbols of the code element B and the code element C, and an absolute value of the update value corresponding to the code element A is a smaller absolute value of absolute values of the code element B and the code element C.

After obtaining the update values corresponding to the code elements that are in the first code word and related to the first row of the check matrix, the processing unit 204 adds each first update value to its corresponding first code element to obtain a second update value, that is, second update values include −5 (a sum of +4 and −9), +3 (a sum of +7 and −4), and −3 (a sum of +4 and −7).

After acquiring the second update values, the processing unit 204 sequentially determines whether each second update value exceeds the code element quantization range.

If the processing unit 204 determines that the $a^{th}$ second update value exceeds the code element quantization range, the processing unit 204 does not update the $a^{th}$ first code element by using the $a^{th}$ second update value, that is, keeps the $a^{th}$ first code element not updated. If the processing unit 204 determines that the $b^{th}$ second update value does not exceed the code element quantization range, the processing unit 204 updates the $b^{th}$ first code element by using the $b^{th}$ second update value.

According to the foregoing example, because P is equal to 3 in this example, a value of a may be 1, 2, or 3 and corresponds to a second update value −5, +3, or −3, respectively. For example, a is set to 1, and the processing unit 204 determines whether the second update value −5 exceeds the code element quantization range. If the second update value −5 exceeds the code element quantization range, −9 is not updated by using −5, that is, the code element −9 keeps unchanged. If the second update value −5 does not exceed the code element quantization range, −9 is updated by using −5, that is, the code element −9 is updated to −5. The processing unit 204 sequentially processes the first code elements −9, +7, and +4 according to the method. For example, the code element quantization range in this embodiment is from −15 to +15 (herein after including −15 and +15). Then, none of the second update values exceeds the code element quantization range. The processing unit 204 generates second code elements after completing the processing corresponding to the first row of the check matrix. The second code elements include −5, +3, and −3. The generation of each code element of the second code elements is to maintain a corresponding first code element (if a corresponding second update value exceeds the code element quantization range) or to update a corresponding first code element by using a corresponding second update value (if the corresponding second update value does not exceed the code element quantization range).

The processing unit 204 generates the second code word according to the second code elements. Mainly two methods for generating the second code word are shown as follows:

Method 1: A second code word is generated by updating, to a second code element, a code element (that is, the first code element) that is in the first code word −9, +7, −12, +4, +7, +10, −11 and related to the $n^{th}$ (n is equal to 1 in this example) row of the check matrix, and a first code element that is in the first code word and unrelated to the $n^{th}$ row of the check matrix is reserved, that is, the second code word is −5, +3, −12, −3, +7, +10, −11.

Method 2: A first temporary code word is generated by updating, to a second code element, a first code element that is in the first code word and related to the $n^{th}$ (n is equal to 1 in this example) row of the check matrix, and a first code element that is in the first code word and unrelated to the first row of the check matrix is reserved, that is, the first temporary code word is −5, +3, −12, −3, +7, +10, −11.

A second temporary code word is generated by updating code elements that are in the first temporary code word and related to the second row of the check matrix. Code elements −12, +4, and +7 that are in the first code word and related to the second row of the check matrix are first acquired. Third update values including +4, −7, and −4 that are corresponding to the code elements that are in the first code word and related to the second row of the check matrix are generated. Fourth update values are generated by adding +4, −7, and −4 to the code elements −12, −3, and +7 that are in the first temporary code word and related to the second row of the check matrix, where the fourth update values include −8, −10, and +3. Whether any one of −8, −10, and +3 exceeds the code element quantization range is determined. If any one of the fourth update values exceeds the code element quantization range, the corresponding code element in the first temporary code word is not updated by using the fourth update value. If none of the fourth update values exceeds the code element quantization range, the first temporary code word −5, +3, −12, −3, +7, +10, −11 is updated by using the fourth update values −8, −10, and +3, so as to obtain a second temporary code word −5, +3, −8, −10, +3, +10, −11.

A second code word is generated by updating code elements that are in the second temporary code word and related to the third row of the check matrix. Code elements +4, +10, and −11 that are in the first code word and related to the third row of the check matrix are first acquired. Fifth update values including −10, −4, and +4 that are corresponding to the code elements that are in the first code word and related to the third row of the check matrix are generated. Sixth update values including −20, +6, and −7 are generated by adding −10, −4, and +4 to the code elements −10, +10, and −11 that are in the second temporary code word and related to the third row of the check matrix. Whether any one of −20, +6, and −7 exceeds the code element quantization range is determined. If any one of the sixth update values exceeds the code element quantization range, the corresponding code element in the second temporary code word is not updated by using the sixth update value. If none of the sixth update values exceeds the code element quantization range, the second temporary code word −5, +3, −8, −10, +3, +10, −11 is updated by using the sixth update values −20, +6, and −7. A second code word −5, +3, −8, −10, +3, +6, −7 is obtained in this example because −20 exceeds the code element quantization range.

It should be noted that, in method 2, the second code word is obtained by processing the first code word according to a sequence from the first row, the second row, to the third row of the check matrix, but in an actual use process of method 2, the first code word may be processed according to another sequence of the check matrix. For example, the first row may be first processed to obtain the first temporary code word, then the third row is processed to obtain the second temporary code word, and then the second row is processed to obtain the second code word. There may be multiple processing sequences. It is only required that, in the process of generating the second code word by using the first code word, each row of the check matrix is processed correspondingly and the processing corresponding to each row of the check matrix is performed only once.

Optionally, the processing unit 204 includes a storage module, configured to store the P first code elements, and is further configured to store the P second update values. When determining that the $a^{th}$ second update value of the P second update values exceeds the code element quantization range, the processing unit 204 reads the $a^{th}$ first code element stored in the storage module. If a second update value exceeds the code element quantization range, the processing unit 204 does not update a corresponding first code element by using the second update value, and therefore reads, from the storage module, the first code element corresponding to the second update value, so as to acquire the second code elements. When determining that the $b^{th}$ second update value of the P second update values does not exceed the code element quantization range, the processing unit 204 reads the $b^{th}$ second update value stored in the storage module, so as to update the $b^{th}$ first code element. If a second update value does not exceed the code element quantization range, the processing unit 204 updates a corresponding first code element by using the second update value, and therefore reads the second update value from the storage module and replaces the corresponding first code element, so as to acquire the second code elements.

According to the foregoing example, the storage module stores the first code elements −9, +7, and +4, and the storage module further stores the second update values −5, +3, and −3. If the processing unit 204 determines that a second update value exceeds the code element quantization range, the processing unit 204 reads a corresponding first code element; if the processing unit 204 determines that a second update value does not exceed the code element quantization range, the processing unit 204 reads a corresponding second update value. In an example in which the processing unit 204 generates the second code word by using method 1, the processing unit 204 determines that none of the second update values −5, +3, and −3 exceeds the code element quantization range, and therefore reads the second update values to update the first code word and generate a second code word −5, +3, −12, −3, +7, +10, −11.

The processing unit 204 sends the second code word to the determining unit 206, where the determining unit 206 is configured to determine whether the second code word is decoded successfully.

In a case in which the processing unit 204 generates the second code word by using method 1 mentioned above, if the determining unit 206 determines that the second code word −5, +3, −12, −3, +7, +10, −11 is decoded successfully, the decoding device 200 continues to perform an update corresponding to another row of the check matrix and generate a second code word corresponding to the row of the check matrix. Herein, the second row is used as an example. After an update corresponding to the second row of the check matrix is complete, an obtained second code word is −5, +3, −8, −10, +3, +10, −11. If the determining unit 206 determines that the second code word −5, +3, −8, −10, +3, +10, −11 is decoded successfully, the decoding device 200 continues to perform an update corresponding to another row of the check matrix and generate a second code word corresponding to the row of the check matrix. Herein, the third row is used as an example. After an update corresponding to the third row of the check matrix is complete, an obtained second code word is −5, +3, −8, −10, +3, +6, −7. If the determining unit 206 determines that the second code word −5, +3, −8, −10, +3, +6, −7 is decoded successfully, the decoding device 200 uses, as a decoding result, a result 1, 0, 1, 1, 0, 0, 1 of mapping −5, +3, −8, −10, +3, +6, −7. Generally, in a case in which the processing unit 204 generates the second code word by using method 1 mentioned above, the decoding device 200 needs to determine that the second code word can pass decision corresponding to a quantity of consecutive rows in the check matrix, and then a result of mapping the second code word corresponding to the last row of the check matrix is a decoding result. For example, the decoding device 200 performs processing according to a sequence from the first row, the second row, to the third row of the check matrix and needs to pass decision of three consecutive rows of the check matrix. If decision of a second code word that is output by the second row of the check matrix fails, a second code word that is output by the third row is decoded successfully, and second code words that are output by both the first row and the second row in a next round of update succeed in decoding, a result of mapping the second code word corresponding to the second row of the check matrix in the next round of update is a decoding result. Each round of update includes processing corresponding to each row of the check matrix, and before processing corresponding to a row of the check matrix in a round of update, an excitation for a code element corresponding to the row in a process of processing the row of the check matrix in a previous round of update needs to be removed.

In a case in which the processing unit 204 generates the second code word by using method 2 mentioned above, if the determining unit 206 determines that the second code word −5, +3, −8, −10, +3, +6, −7 is decoded successfully, a result 1, 0, 1, 1, 0, 0, 1 of mapping the second code word is a decoding result. If the second code word fails to be decoded, a next round of update is performed.

This embodiment provides a decoding device. The decoding device performs processing in a case that occurs in a code word update process and in which a value of an updated code element exceeds a code element quantization range, which prevents the decoding device from directly quantizing an updated code word that exceeds the quantization range, and improves an error correction capability of the decoding device in an LDPC code decoding process.

Device Embodiment 2

Figure 4:
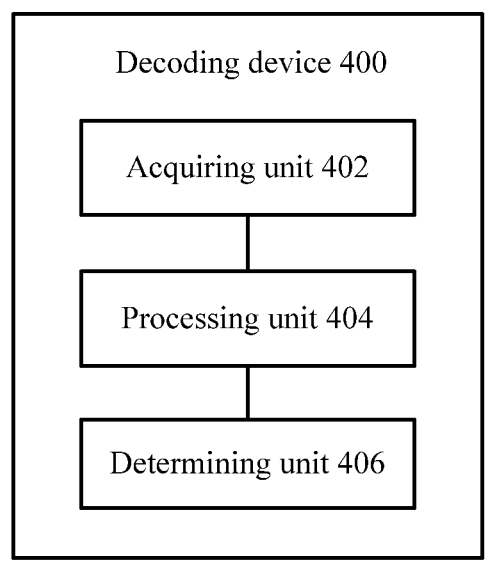
FIG. 4 is a block diagram of a decoding device according to device embodiment 2 of the present application.

Device embodiment 2 provides a decoding device 400, where the decoding device 400 is configured to decode an LDPC code. FIG. 4 shows a schematic diagram of a composite structure of the decoding device 400. The device 400 includes: an acquiring unit 402, a processing unit 404, and a determining unit 406.

The acquiring unit 402 is configured to acquire a first code word, where the first code word is generated by an LDPC code encoding device according to a generator matrix and includes M first code elements and M is a positive integer. For details, refer to the LDPC code encoding and decoding architecture mentioned above. The code word acquired by the acquiring unit 402 may be transmitted through a communications channel, or may be read from a storage medium. The first code element herein is any code element in the first code word.

The processing unit 404 is configured to acquire P first code elements corresponding to the $n^{th}$ row of a check matrix; acquire P first update values corresponding to the P first code elements; obtain, according to the P first update values, P second update values corresponding to the P first code elements; sequentially determine whether each second update value of the P second update values exceeds a code element quantization range; keep the P first code elements not updated when the $a^{th}$ second update value of the P second update values exceeds the code element quantization range; update the P first code elements by using the P second update values when each second update value of the P second update values does not exceed the code element quantization range; obtain, according to the foregoing update operation, P second code elements corresponding to the $n^{th}$ row of the check matrix; and generate a second code word according to the P second code elements, where the check matrix corresponds to the generator matrix and includes N rows, $1 \leq n \leq N$, $P \leq M$, $1 \leq a \leq P$, $1 \leq b \leq P$, and each second update value is a sum of each first update value and a corresponding first code element.

The determining unit 406 is configured to acquire the second code word generated by the determining processing unit 404 and determine whether the second code word is decoded successfully.

$$\begin{vmatrix} 1 & 1 & 0 & 1 & 0 & 0 & 0 \\ 0 & 0 & 1 & 1 & 1 & 0 & 0 \\ 0 & 0 & 0 & 1 & 0 & 1 & 1 \end{vmatrix}$$

In this embodiment, for example, the foregoing check matrix is used by the decoding device, that is, N is equal to 3, and the first code word acquired by the acquiring unit 402 is −9, +7, −12, +4, +7, +10, −11, that is, M is equal to 7. The processing unit 404 generates, according to a code element that is in the first code word and related to the first row of the check matrix, an update value that is corresponding to the code element that is in the code word and related to the first row of the check matrix, that is, n is equal to 1. It should be noted that, during actual operation, the processing unit 404 may perform processing according to a sequence from the first row, the second row, to the third row of the check matrix, or may perform processing according to another sequence, where a value of n herein may be any positive integer less than or equal to a quantity of rows of the check matrix. After acquiring code elements related to the first row of the check matrix, namely, the $1^{st}$ code element −9, the $2^{nd}$ code element +7, and the $4^{th}$ code element +4, where the first code elements include −9, +7, and +4, the processing unit 404 generates an update value +4 corresponding to the first code element in the first code word, an update value −4 corresponding to the second code element, and an update value −7 corresponding to the fourth code element, that is, P is equal to 3, and the first update values include +4, −4, and −7. A symbol of a first update value corresponding to each first code element of the P first code elements is a product of symbols of other first code elements except this first code element, and an absolute value of the first update value corresponding to each first code element of the P first code elements is an absolute value of a first code element with a smallest absolute value (if this first code element itself is the first code element with the smallest absolute value, the absolute value of the first update value corresponding to this first code element is set to an absolute value of a first code element with a second smallest absolute value). For example, if first code elements include a code element A, a code element B, and a code element C, a symbol of an update value corresponding to the code element A is a product of symbols of the code element B and the code element C, and an absolute value of the update value corresponding to the code element A is a smaller absolute value of absolute values of the code element B and the code element C.

After obtaining the update values corresponding to the code elements that are in the first code word and related to the first row of the check matrix, the processing unit 404 adds each first update value to its corresponding first code element to obtain a second update value, that is, second update values include −5 (a sum of +4 and −9), +3 (a sum of +7 and −4), and −3 (a sum of +4 and −7).

After acquiring the second update values, the processing unit 404 sequentially determines whether each second update value exceeds the code element quantization range; if the processing unit 404 determines that the $a^{th}$ second update value exceeds the code element quantization range, the processing unit 404 does not update the P first code elements by using the P second update values, that is, keeps the P first code elements not updated; and if the processing unit 404 determines that each second update value of the P second update values does not exceed the code element quantization range, the processing unit 404 updates the P first code elements by using the P second update values.

According to the foregoing example, because P is equal to 3 in this example, a value of a may be 1, 2, or 3 and corresponds to a second update value −5, +3, or −3, respectively. For example, a is set to 1, and the processing unit 404 determines whether the second update value −5 exceeds the code element quantization range; if the second update value −5 exceeds the code element quantization range, −9 is not updated by using −5, −4 is not updated by using +3, and −7 is not updated by using −3; similarly, if another second update value exceeds the code element quantization range, updating the first code elements by using any one of the second update values is abandoned; if none of the second update values −5, +3, and −3 exceeds the code element quantization range, −9 is updated by using −5, −4 is updated by using +3, and −7 is updated by using −3. For example, the code element quantization range in this embodiment is from −15 to +15. Then, none of the second update values exceeds the code element quantization range. The processing unit 404 generates second code elements after completing the processing corresponding to the first row of the check matrix. The second code elements include −5, +3, and −3. The generation of each code element of the second code elements is to maintain a corresponding first code element (if any one of the second update values exceeds the code element quantization range) or to update a corresponding first code element by using a corresponding second update value (if none of the second update values exceeds the code element quantization range).

The processing unit 404 generates the second code word according to the second code elements. Mainly two methods for generating the second code word are shown as follows:

Method 1: A second code word is generated by updating, to a second code element, a code element (that is, the first code element) that is in the first code word −9, +7, −12, +4, +7, +10, −11 and related to the $n^{th}$ (n is equal to 1 in this example) row of the check matrix, and a first code element that is in the first code word and unrelated to the $n^{th}$ row of the check matrix is reserved, that is, the second code word is −5, +3, −12, −3, +7, +10, −11.

Method 2: A first temporary code word is generated by updating, to a second code element, a first code element that is in the first code word and related to the $n^{th}$ (n is equal to 1 in this example) row of the check matrix, and a first code element that is in the first code word and unrelated to the first row of the check matrix is reserved, that is, the first temporary code word is −5, +3, −12, −3, +7, +10, −11.

A second temporary code word is generated by updating code elements that are in the first temporary code word and related to the second row of the check matrix. Code elements −12, +4, and +7 that are in the first code word and related to the second row of the check matrix are first acquired. Third update values including +4, −7, and −4 that are corresponding to the code elements that are in the first code word and related to the second row of the check matrix are generated. Fourth update values are generated by adding +4, −7, and −4 to the code elements −12, −3, and +7 that are in the first temporary code word and related to the second row of the check matrix, where the fourth update values include −8, −10, and +3. Whether any one of −8, −10, and +3 exceeds the code element quantization range is determined. If any one of the fourth update values exceeds the code element quantization range, the first temporary code word is not updated by using the fourth update values. If none of the fourth update values exceeds the code element quantization range, the first temporary code word −5, +3, −12, −3, +7, +10, −11 is updated by using the fourth update values −8, −10, and +3, so as to obtain a second temporary code word −5, +3, −8, −10, +3, +10, −11.

A second code word is generated by updating code elements that are in the second temporary code word and related to the third row of the check matrix. Code elements +4, +10, and −11 that are in the first code word and related to the third row of the check matrix are first acquired. Fifth update values including −10, −4, and +4 that are corresponding to the code elements that are in the first code word and related to the third row of the check matrix are generated. Sixth update values including −20, +6, and −7 are generated by adding −10, −4, and +4 to the code elements −10, +10, and −11 that are in the second temporary code word and related to the third row of the check matrix. Whether any one of −20, +6, and −7 exceeds the code element quantization range is determined. If any one of the sixth update values exceeds the code element quantization range, the second temporary code word is not updated by using the sixth update values. If none of the sixth update values exceeds the code element quantization range, the second temporary code word −5, +3, −8, −10, +3, +10, −11 is updated by using the sixth update values −20, +6, and −7. A second code word −5, +3, −8, −10, +3, +10, −11 is obtained in this example because the sixth update value −20 exceeds the code element quantization range.

It should be noted that, in method 2, the second code word is obtained by processing the first code word according to a sequence from the first row, the second row, to the third row of the check matrix, but in an actual use process of method 2, the first code word may be processed according to another sequence of the check matrix. For example, the first row may be first processed to obtain the first temporary code word, then the third row is processed to obtain the second temporary code word, and then the second row is processed to obtain the second code word. There may be multiple processing sequences. It is only required that, in the process of generating the second code word by using the first code word, each row of the check matrix is processed correspondingly and the processing corresponding to each row of the check matrix is performed only once.

Optionally, the processing unit 404 includes a storage module, configured to store the P first code elements, and is further configured to store the P second update values. When determining that the $a^{th}$ second update value of the P second update values exceeds the code element quantization range, the processing unit 404 reads the P first code elements stored in the storage module; that is, if a second update value exceeds the code element quantization range, the processing unit 404 does not update the first code elements by using the second update values, and therefore reads the P first code elements from the storage module, so as to acquire the second code elements. When determining that each second update value of the P second update values does not exceed the code element quantization range, the processing unit 404 reads the P second update values stored in the storage module; that is, if none of the second update values exceeds the code element quantization range, the processing unit 404 updates the corresponding P first code elements by using the P second update values, and therefore reads the P second update values from the storage module and replaces the P first code elements, so as to acquire the second code elements.

According to the foregoing example, the storage module stores the first code elements −9, +7, and +4, and the storage module further stores the second update values −5, +3, and −3. If the processing unit 404 determines that a second update value exceeds the code element quantization range, the processing unit 404 reads the first code elements −9, +7, and +4 and abandons updating the first code elements by using any one of the second update values. If the processing unit 404 determines that none of the second update values exceeds the code element quantization range, the processing unit 404 reads the P second update values. For example, the processing unit 404 generates the second code word by using method 1. The processing unit 404 determines that none of the second update values −5, +3, and −3 exceeds the code element quantization range, the processing unit 404 reads the second update values −5, +3, and −3 to update the first code word and generate the second code word −5, +3, −12, −3, +7, +10, −11.

The processing unit 404 sends the second code word to the determining unit 406, where the determining unit 406 is configured to determine whether the second code word is decoded successfully.

In a case in which the processing unit 404 generates the second code word by using method 1 mentioned above, if the determining unit 406 determines that the second code word −5, +3, −12, −3, +7, +10, −11 is decoded successfully, the decoding device 400 continues to perform an update corresponding to another row of the check matrix and generate a second code word corresponding to the row of the check matrix. Herein, the second row is used as an example. After an update corresponding to the second row of the check matrix is complete, an obtained second code word is −5, +3, −8, −10, +3, +10, −11. If the determining unit 406 determines that the second code word −5, +3, −8, −10, +3, +10, −11 is decoded successfully, the decoding device 400 continues to perform an update corresponding to another row of the check matrix and generate a second code word corresponding to the row of the check matrix. Herein, the third row is used as an example. After an update corresponding to the third row of the check matrix is complete, because an update value corresponding to the code element −10 exceeds the code element quantization range, the update corresponding to the third row of the check matrix is invalid and a second code word −5, +3, −8, −10, +3, +10, −11 is obtained. If the determining unit 406 determines that the second code word −5, +3, −8, −10, +3, +10, −11 is decoded successfully, the decoding device 400 uses, as a decoding result, a result 1, 0, 1, 1, 0, 0, 1 of mapping −5, +3, −8, −10, +3, +10, −11. Generally, in a case in which the processing unit 404 generates the second code word by using method 1 mentioned above, the decoding device 400 needs to determine that the second code word can pass decision corresponding to a quantity of consecutive rows in the check matrix, and then a result of mapping the second code word corresponding to the last row of the check matrix is a decoding result. For example, the decoding device 400 performs processing according to a sequence from the first row, the second row, to the third row of the check matrix and needs to pass decision of three consecutive rows of the check matrix. If decision of a second code word that is output by the second row of the check matrix fails, a second code word that is output by the third row is decoded successfully, and second code words that are output by both the first row and the second row in a next round of update succeed in decoding, a result of mapping the second code word corresponding to the second row of the check matrix in the next round of update is a decoding result. Each round of update includes processing corresponding to each row of the check matrix, and before processing corresponding to a row of the check matrix in a round of update, an excitation for a code element corresponding to the row in a process of processing the row of the check matrix in a previous round of update needs to be removed.

In a case in which the processing unit 404 generates the second code word by using method 2 mentioned above, if the determining unit 406 determines that the second code word −5, +3, −8, −10, +3, +10, −11 is decoded successfully, a result 1, 0, 1, 1, 0, 0, 1 of mapping the second code word is a decoding result. If the second code word fails to be decoded, a next round of update is performed.

This embodiment provides a decoding device. The decoding device performs processing in a case that occurs in a code word update process and in which a value of an updated code element exceeds a code element quantization range, which prevents the decoding device from directly quantizing an updated code word that exceeds the quantization range, and improves an error correction capability of the decoding device in an LDPC code decoding process.

Device Embodiment 3

Figure 5:
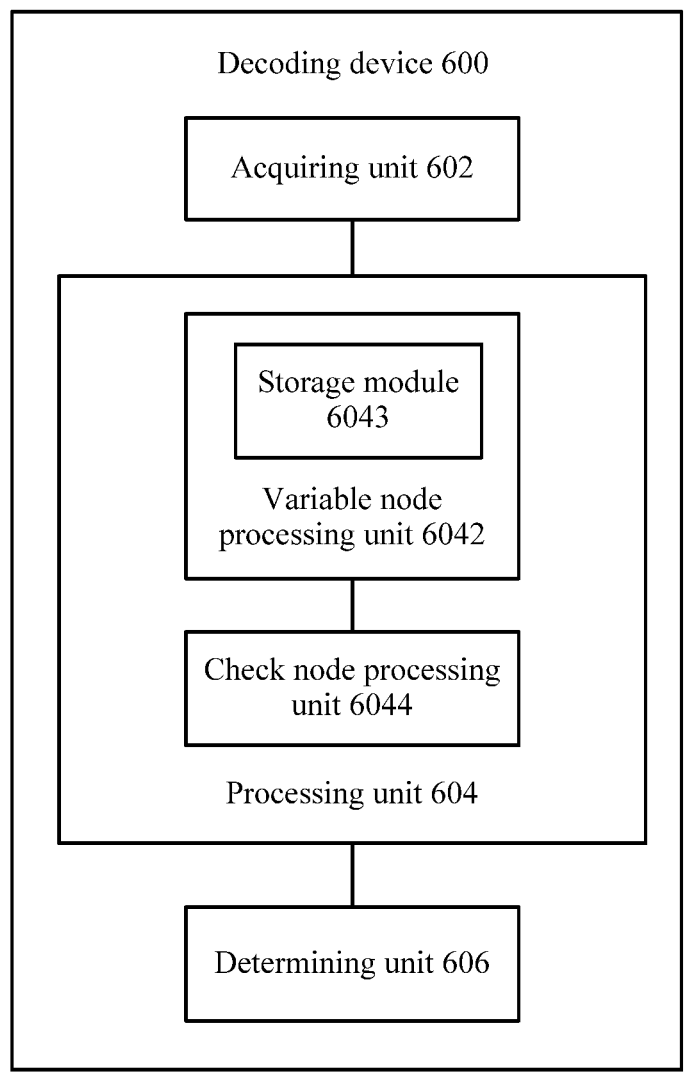
FIG. 5 is a block diagram of a decoding device according to device embodiment 3 of the present application.

Device embodiment 3 provides a decoding device 600. FIG. 5 shows a schematic diagram of a composite structure of the decoding device 600. In this embodiment, an internal composite structure of the processing unit 204 in device embodiment 1 is detailed as a processing unit 604. An overall function of the processing unit 604 in this embodiment is the same as that of the processing unit 204 in device embodiment 1.

The following describes in detail an operation principle of the decoding device 600 proposed in device embodiment 3 by using an example in which a code word acquired by the decoding device 600 is −9, +7, −12, +4, +7, +10, −11, a code element quantization range is from −15 to +15, and the following check matrix is used by the decoding device 600.

$$\begin{vmatrix} 1 & 1 & 0 & 1 & 0 & 0 & 0 \\ 0 & 0 & 1 & 1 & 1 & 0 & 0 \\ 0 & 0 & 0 & 1 & 0 & 1 & 1 \end{vmatrix}$$

After acquiring the code word −9, +7, −12, +4, +7, +10, −11, an acquiring unit 602 first sends the code word to a determining unit 606, and the determining unit 606 maps negative values in the code word to 1 and maps positive values to 0 to obtain a mapped code word 1, 0, 1, 0, 0, 0, 1, and performs an exclusive OR operation, also referred to as a sum modulo 2 or an addition modulo 2 operation, on each code element in the mapped code word according to a check equation. According to an operation on the first row of the check matrix, (1+0+0) mod (2)=1, and the code word fails to be decoded. If the code word acquired by the decoding device 600 passes decision of the determining unit 606 before the code word is processed by the processing unit 604, the code word does not need subsequent processing, and the decoding device 600 directly uses a mapping result of the code word as a decoding result. The code word 1, 0, 1, 0, 0, 0, 1 needs to pass check corresponding to all three rows of the check matrix before the determining unit 606 determines that the code word is decoded successfully.

A variable node processing unit 6042 receives the code word −9, +7, −12, +4, +7, +10, −11 and stores −9, +7, −12, +4, +7, +10, −11 to a storage module 6043. It can be learned from the first row of the check matrix that the first, the second, and the fourth variable nodes are related to the first row of the check matrix, that is, the three code elements −9, +7, and +4 are related to the first row of the check matrix. The variable node processing unit 6042 sends −9, +7, and +4 to a check node processing unit 6044. In practice, processing may start from any row of the check matrix. It should be noted that, if an update of a corresponding row of the check matrix or updates corresponding to all rows of the check matrix are already performed, the variable node processing unit 6042 further needs to remove impact of a previous round of update values on the code word before performing this round of update.

After receiving −9, +7, and +4, the check node processing unit 6044 generates, according to the first row of the check matrix, an update value +4 for returning to the first variable node, an update value −4 for returning to the second variable node, and an update value −7 for returning to the fourth variable node, and sends the three update values to the variable node processing unit 6042.

The variable node processing unit 6042 may subsequently perform either of the following two solutions:

Solution 1: After receiving update values, the variable node processing unit 6042 adds code elements of the first, the second, and the fourth variable nodes to their corresponding update values, and therefore, the code element corresponding to the first variable node is updated to −5, the code element corresponding to the second variable node is updated to +3, and the code element corresponding to the fourth variable node is updated to −3; stores the updated code elements of the first, the second, and the fourth variable nodes in the storage module 6043; if an update value of a code element corresponding to any variable node in an update process exceeds the code element quantization range, that is, from −15 to +15, abandons the update of the code element corresponding to the variable node, reads, from the storage module 6043, the code element before the update, continues to update a code element corresponding to a next variable node, and repeats the foregoing determining actions for the update of the code element corresponding to the next variable node, until processing of all code elements corresponding to the first variable node, the second variable node, and the fourth variable node is complete.

Figure 6:
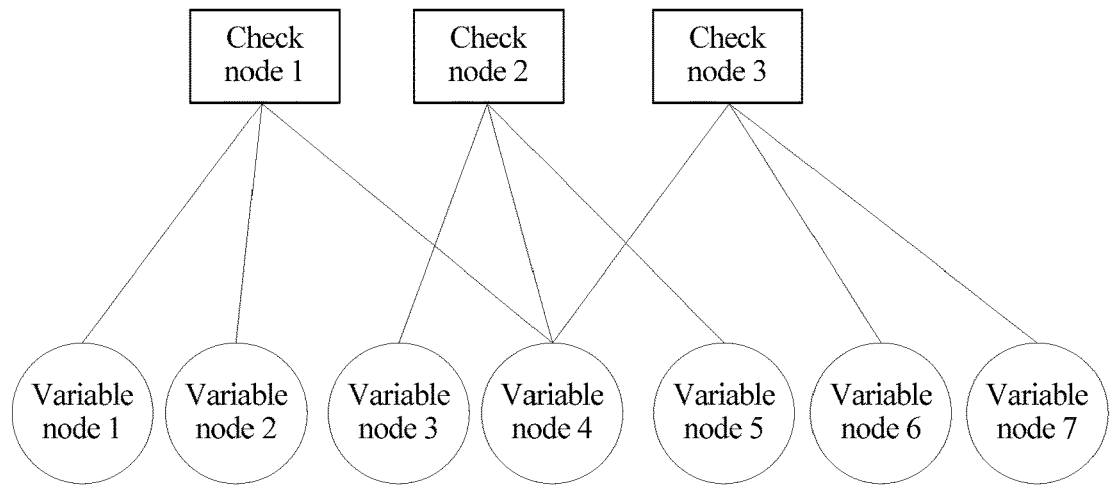
FIG. 6 is a Tanner diagram corresponding to a check matrix applied in decoding devices according to device embodiment 3 and device embodiment 4 of the present application.

Solution 2: After receiving update values, the variable node processing unit 6042 stores all the update values; adds code elements of the first, the second, and the fourth variable nodes to their corresponding update values; if an update value of a code element corresponding to any variable node in an update process exceeds the code element quantization range, that is, from −15 to +15, abandons the update of the code element corresponding to the variable node, reads, from the storage module 6043, the code element before the update, and continues to update a code element corresponding to a next variable node; after updates of the first row of the check matrix are complete, continues to update the second row of the check matrix, that is, perform update processing corresponding to a check node 2 in a Tanner diagram shown in FIG. 6. In FIG. 6, a variable node 1 to a variable node 7 correspond to seven code elements received by the variable node processing unit 6042 respectively, and a check node 1 to a check node 3 correspond to the first row to the third row of the check matrix respectively. In FIG. 6, a processing action performed by the variable node 1 to the variable node 7 is also performed by the variable node processing unit 6042 in FIG. 5, and a processing action performed by the check node 1 to the check node 3 is also performed by the check node processing unit 6044 in FIG. 5.

After the check node 1 returns update values to the variable node 1, the variable node 2, and the variable node 4, if none of updated code elements corresponding to the variable node 1, the variable node 2, and the variable node 4 exceeds the code element quantization range, the variable node 3, the variable node 4, and the variable node 5 continues to send corresponding code elements to the check node 2, and the check node 2 generates corresponding update values and then returns the update values to corresponding variable nodes, and if the code element quantization range is still not exceeded, an update corresponding to the check node 3 continues. In this case, because the code element corresponding to the variable node 4 participates in the processing corresponding to the check node 1 and also participates in the processing corresponding to the check node 2 and the processing corresponding to the check node 3, in FIG. 6, if a sum of the code element +4 corresponding to the variable node 4 and an update value −7 returned by the check node 1 does not exceed the code element quantization range, a sum of a code element corresponding to a variable node and an update value returned by another check node may exceed the code element quantization range. In an example shown in FIG. 6, the updates returned by the check node 1, the check node 2, and the check node 3 to the variable node 4 are −7, −7, and −10 respectively. After the three update values are added to the code element +4, obtained −20 exceeds the code element quantization range. Because all update values are already stored, the three update values are sorted to obtain an update value that has the greatest impact on the exceeding of the code element quantization range. Because the code element in this example exceeds a minimum value of the code element quantization range, the update value with the greatest impact is an update value with a smallest value, that is, −10, the variable node 4 abandons the update value −10 returned by the check node 3, that is, after this round of update, a code element corresponding to the variable node 4 is +4+(−7)+(−7), and equals to −10. In solution 2, after a sum of a code element of any variable node and update values returned by multiple check nodes exceeds the code element quantization range, the update values received by the variable node are sorted; when the sum of the code element of the variable node and the update values exceeds a maximum value of the code element quantization range, the variable node first abandons a largest value of the update values; and when the sum of the code element of the variable node and the update values exceeds a minimum value of the code element quantization range, the variable node first abandons a smallest value of the update values, which ensures that the abandoned update value has least impact on a decoding process.

Each time the variable node processing unit 6042 completes updating code elements corresponding to one row of the check matrix, that is, processing an update value sent by one check node, the variable node processing unit 6042 sends an updated code word to the determining unit 606, and the determining unit 606 maps the updated code word and determines whether this row of code word passes decision. In the previous example, after updates of code elements corresponding to variable nodes corresponding to the first row of the check matrix are complete, an updated code word is −5, +3, −12, −3, +7, +10, −11, and the determining unit 606 performs decision on the updated code word. For details, refer to how the processing unit 204 generates the second code word by using method 1 in device embodiment 1. After updating the code elements corresponding to one row of the check matrix and acquiring the updated code word, the variable node processing unit 6042 may further continue to generate the second code word by using method 2 used by the processing unit 204 in device embodiment 1, and send the second code word to the determining unit 606. It should be noted that, before performing mapping and decision on the code word, the determining unit 606 may further perform minimum offset algorithm processing on the code word, or may further perform normalized min-sum algorithm processing on the code word.

This embodiment provides a decoding device. The decoding device performs processing in a case that occurs in a code word update process and in which a value of an updated code element exceeds a code element quantization range, which prevents the decoding device from directly quantizing an updated code word that exceeds the code element quantization range, and improves an error correction capability of the decoding device in a decoding process.

Device Embodiment 4

Figure 7:
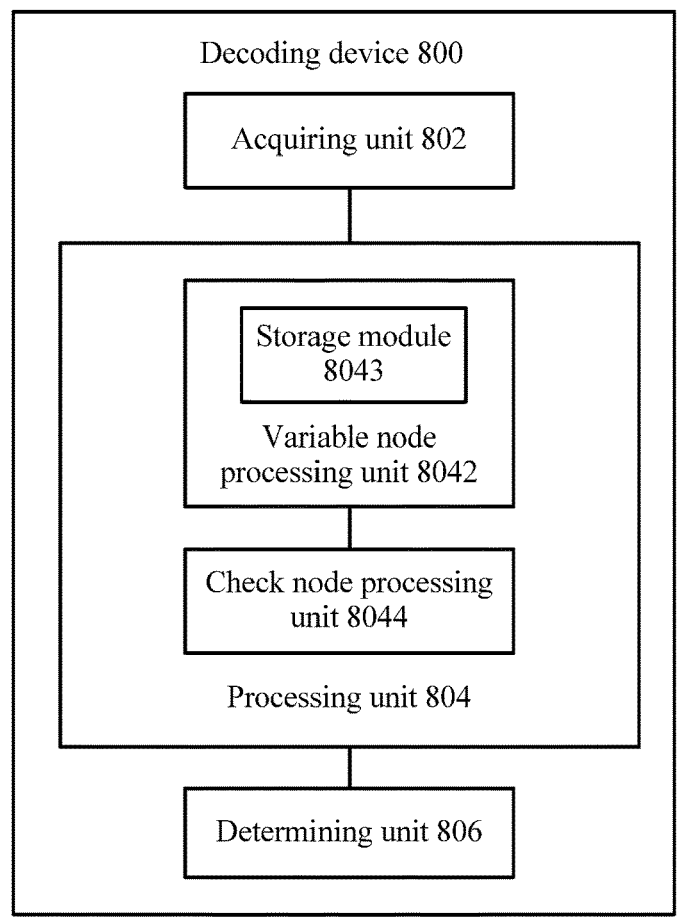
FIG. 7 is a block diagram of a decoding device according to device embodiment 4 of the present application.

Device embodiment 4 provides a decoding device 800. FIG. 7 shows a schematic diagram of a composite structure of the decoding device 800. In this embodiment, an internal composite structure of the processing unit 404 in device embodiment 2 is detailed as a processing unit 804. An overall function of the processing unit 804 in this embodiment is the same as that of the processing unit 404 in device embodiment 2.

The following describes in detail an operation principle of the decoding device 800 proposed in device embodiment 4 by using an example in which a code word acquired by the decoding device 800 is −9, +7, −12, +4, +7, +10, −11, a code element quantization range is from −15 to +15, and the following check matrix is used by the decoding device 800.

$$\begin{vmatrix} 1 & 1 & 0 & 1 & 0 & 0 & 0 \\ 0 & 0 & 1 & 1 & 1 & 0 & 0 \\ 0 & 0 & 0 & 1 & 0 & 1 & 1 \end{vmatrix}$$

After acquiring the code word −9, +7, −12, +4, +7, +10, −11, an acquiring unit 802 first sends the code word to a determining unit 806, and the determining unit 806 maps negative values in the code word to 1 and maps positive values to 0 to obtain a mapped code word 1, 0, 1, 0, 0, 0, 1, and performs an exclusive OR operation, also referred to as a sum modulo 2 or an addition modulo 2 operation, on each code element in the mapped code word according to a check equation. According to an operation on the first row of the check matrix, (1+0+0) mod (2)=1, and the code word fails to be decoded. If the code word acquired by the decoding device 800 passes decision of the determining unit 806 before the code word is processed by the processing unit 804, the code word does not need subsequent processing, and the decoding device 800 directly uses a mapping result of the code word as a decoding result. The code word 1, 0, 1, 0, 0, 0, 1 needs to pass check corresponding to all three rows of the check matrix before the determining unit 806 determines that the code word is decoded successfully.

A variable node processing unit 8042 receives the code word −9, +7, −12, +4, +7, +10, −11 and stores −9, +7, −12, +4, +7, +10, −11 to a storage module 8043. It can be learned from the first row of the check matrix that the first, the second, and the fourth variable nodes are related to the first row of the check matrix, that is, the three code elements −9, +7, and +4 are related to the first row of the check matrix. The variable node processing unit 8042 sends −9, +7, and +4 to a check node processing unit 8044. In practice, processing may start from any row of the check matrix. It should be noted that, if an update of a corresponding row of the check matrix or updates corresponding to all rows of the check matrix are already performed, the variable node processing unit 8042 further needs to remove impact of a previous round of update values on the code word before performing this round of update.

After receiving −9, +7, and +4, the check node processing unit 8044 generates, according to the first row of the check matrix, an update value +4 for returning to the first variable node, an update value −4 for returning to the second variable node, and an update value −7 for returning to the fourth variable node, and sends the three update values to the variable node processing unit 8042.

The variable node processing unit 8042 subsequently performs the following solution: after receiving update values, adding code elements of the first, the second, and the fourth variable nodes to their corresponding update values, where the code element corresponding to the first variable node is updated to −5, the code element corresponding to the second variable node is updated to +3, and the code element corresponding to the fourth variable node is updated to −3; storing the updated code elements of the first, the second, and the fourth variable nodes in the storage module 8043; if an update value of a code element corresponding to any variable node exceeds the code element quantization range in an update process, abandoning this round of update of the code elements corresponding to the first, the second, and the fourth variable nodes, and reading, from the storage module 8043, the code elements corresponding to the first, the second, and the fourth variable nodes before the update.

Each time the variable node processing unit 8042 completes updating code elements corresponding to one row of the check matrix, that is, processing an update value sent by one check node, the variable node processing unit 8042 sends an updated code word to the determining unit 806, and the determining unit 806 maps the updated code word and determines whether this row of code word passes decision. In the previous example, after updates of code elements corresponding to variable nodes corresponding to the first row of the check matrix are complete, an updated code word is −5, +3, −12, −3, +7, +10, −11, and the determining unit 806 performs decision on the updated code word. For details, refer to how the processing unit 404 generates the second code word by using method 1 in device embodiment 2. After updating the code elements corresponding to one row of the check matrix and acquiring the updated code word, the variable node processing unit 8042 may further continue to generate the second code word by using method 2 used by the processing unit 404 in device embodiment 2, and send the second code word to the determining unit 806. It should be noted that, before performing mapping and decision on the code word, the determining unit 806 may further perform minimum offset algorithm processing on the code word, or may further perform normalized min-sum algorithm processing on the code word.

This embodiment provides a decoding device. The decoding device performs processing in a case that occurs in a code word update process and in which a value of an updated code element exceeds a code element quantization range, which prevents the decoding device from directly quantizing an updated code word that exceeds the code element quantization range, and improves an error correction capability of the decoding device in a decoding process.

Method Embodiment 1

Figure 8:
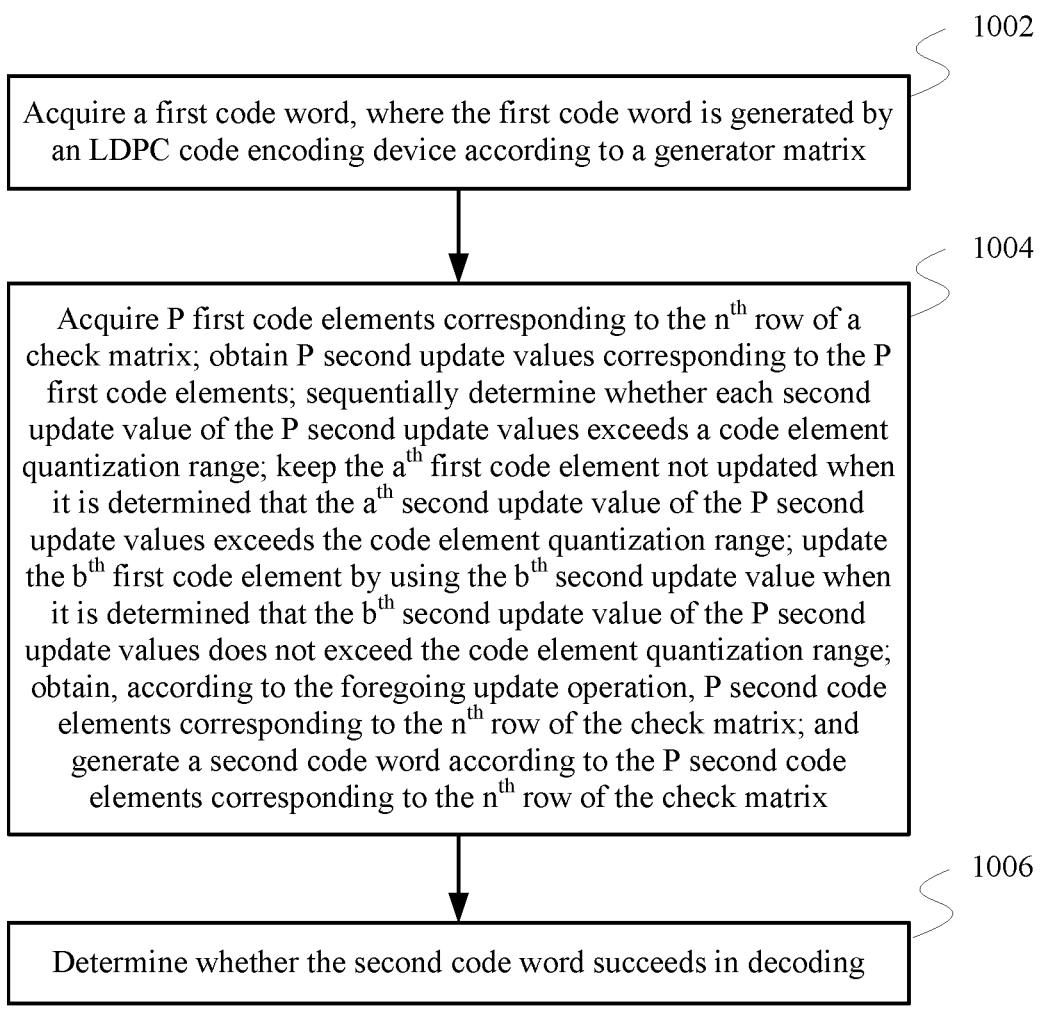
FIG. 8 is a flowchart of a decoding method according to method embodiment 1 of the present application.

This method embodiment provides a decoding method, where the decoding method is used to decode an LDPC code. This method may be performed by the decoding device 200 according to device embodiment 1 or be performed by the decoding device 600 according to device embodiment 3. FIG. 8 shows a schematic flowchart of the decoding method. The method includes:

Step 1002: Acquire a first code word, where the first code word is generated by an LDPC code encoding device according to a generator matrix and includes M first code elements and M is a positive integer. For details about execution of step 1002, refer to the acquiring unit 202 in device embodiment 1 or the acquiring unit 602 in device embodiment 3.

Step 1004: Acquire P first code elements corresponding to the $n^{th}$ row of a check matrix; acquire P first update values corresponding to the P first code elements; obtain, according to the P first update values, P second update values corresponding to the P first code elements; sequentially determine whether each second update value of the P second update values exceeds a code element quantization range; keep the $a^{th}$ first code element not updated when the $a^{th}$ second update value of the P second update values exceeds the code element quantization range; update the $b^{th}$ first code element by using the $b^{th}$ second update value when the $b^{th}$ second update value of the P second update values does not exceed the the code element quantization range; obtain, according to the foregoing update operation, P second code elements corresponding to the $n^{th}$ row of the check matrix; and generate a second code word according to the P second code elements corresponding to the $n^{th}$ row of the check matrix, where the check matrix corresponds to the generator matrix and includes N rows, $1 \leq n \leq N$, $P \leq M$, $1 \leq a \leq P$, $1 \leq b \leq P$, and each second update value is a sum of each first update value and a corresponding first code element. For details about execution of step 1004, refer to the processing unit 204 in device embodiment 1, or the processing unit 604 and all subunits of the processing unit 604 in device embodiment 3.

Step 1006: Determine whether the second code word generated in step 1004 is decoded successfully. For details about execution of step 1006, refer to the determining unit 206 in device embodiment 1 or the determining unit 606 in device embodiment 3.

According to the decoding method provided in this embodiment, processing is performed in a case that occurs in a code word update process and in which a value of an updated code element exceeds a code element quantization range, which prevents direct quantization of an updated code word that exceeds the code element quantization range in a decoding process, and improves an LDPC code error correction capability.

Method Embodiment 2

Figure 9:
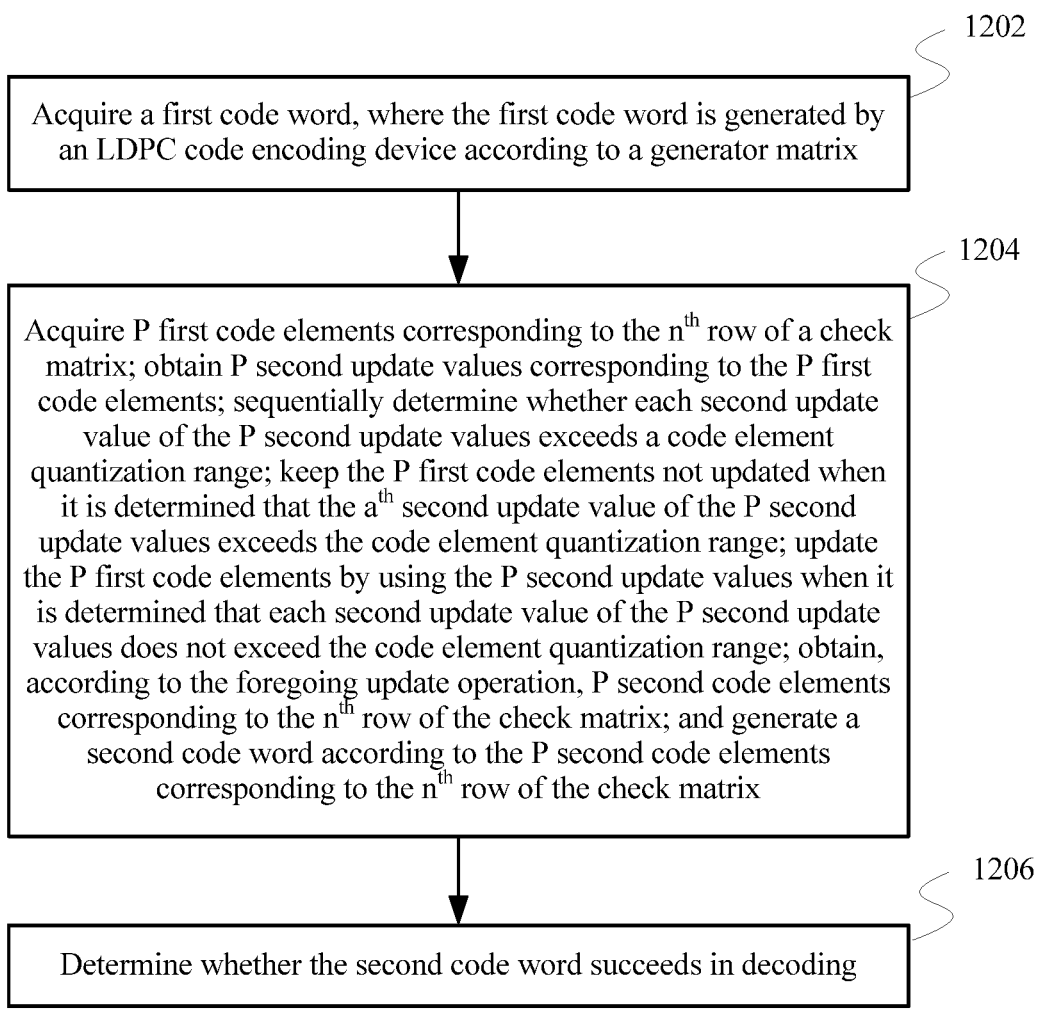
FIG. 9 is a flowchart of a decoding method according to method embodiment 2 of the present application.

This method embodiment provides a decoding method, where the decoding method is used to decode an LDPC code. This method may be performed by the decoding device 400 according to device embodiment 2 or be performed by the decoding device 800 according to device embodiment 4. FIG. 9 shows a schematic flowchart of the decoding method. The method includes:

Step 1202: Acquire a first code word, where the first code word is generated by an LDPC code encoding device according to a generator matrix and includes M first code elements and M is a positive integer. For details about execution of step 1202, refer to the acquiring unit 402 in device embodiment 2 or the acquiring unit 802 in device embodiment 4.

Step 1204: Acquire P first code elements corresponding to the $n^{th}$ row of a check matrix; acquire P first update values corresponding to the P first code elements; obtain, according to the P first update values, P second update values corresponding to the P first code elements; sequentially determine whether each second update value of the P second update values exceeds a code element quantization range; keep the P first code elements not updated when the $a^{th}$ second update value of the P second update values exceeds the code element quantization range; update the P first code elements by using the P second update values when each second update value of the P second update values does not exceed the code element quantization range; obtain, according to the foregoing update operation, P second code elements corresponding to the $n^{th}$ row of the check matrix; and generate a second code word according to the P second code elements, where the check matrix corresponds to the generator matrix and includes N rows, $1 \leq n \leq N$, $P \leq M$, $1 \leq a \leq P$, $1 \leq b \leq P$, and each second update value is a sum of each first update value and a corresponding first code element. For details about execution of step 1204, refer to the processing unit 404 in device embodiment 2, or the processing unit 804 and all subunits of the processing unit 804 in device embodiment 4.

Step 1206: Determine whether the second code word generated in step 1204 is decoded successfully. For details about execution of step 1206, refer to the determining unit 406 in device embodiment 2 or the determining unit 806 in device embodiment 4.

According to the decoding method provided in this embodiment, processing is performed in a case that occurs in a code word update process and in which a value of an updated code element exceeds a code element quantization range, which prevents direct quantization of an updated code word that exceeds the code element quantization range in a decoding process, and improves an LDPC code error correction capability.

Method Embodiment 3

Figure 10:
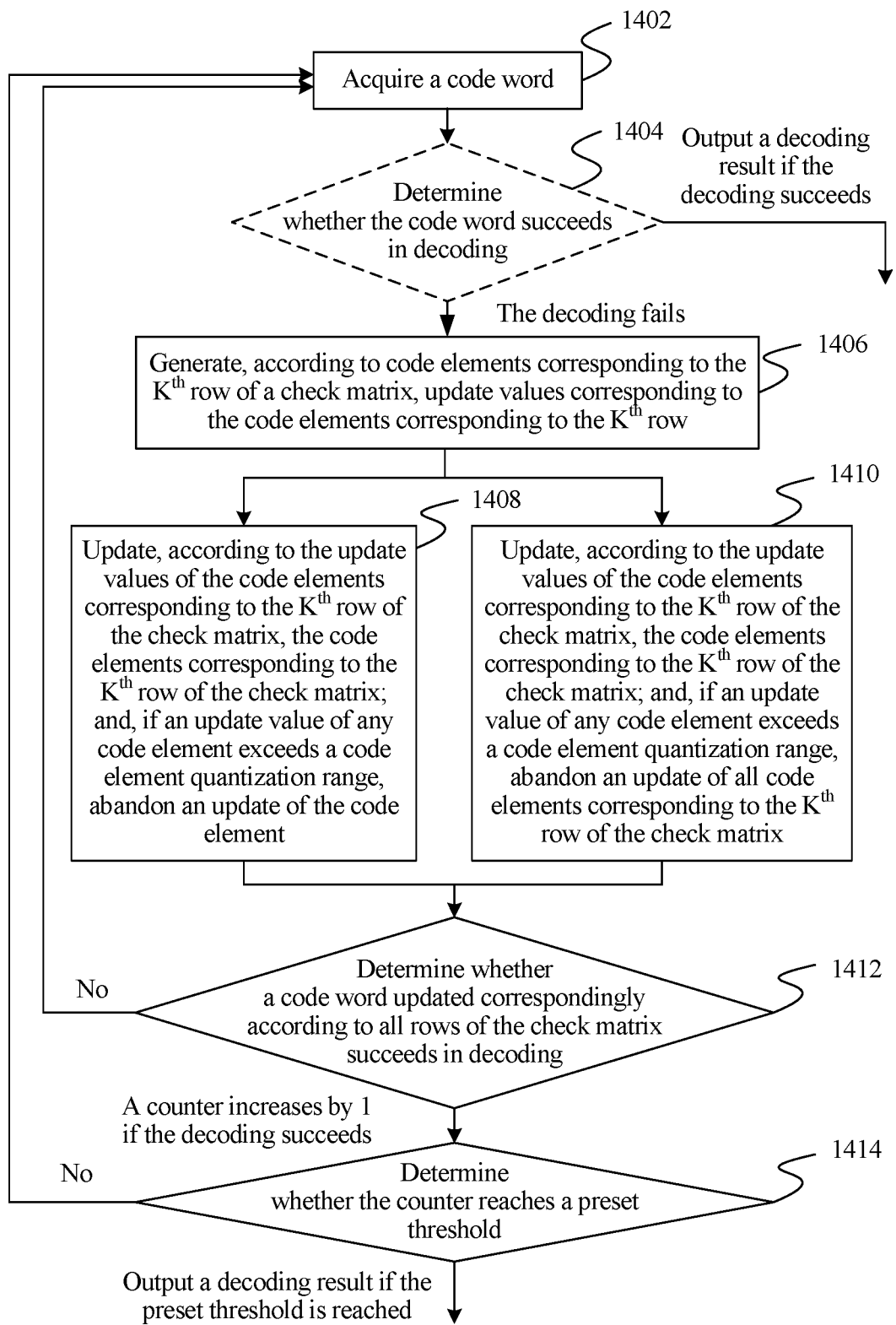
FIG. 10 is a flowchart of a decoding method according to method embodiment 3 of the present application.

This method embodiment provides a decoding method. Because an LDPC code is being decoded, this method may be performed by any one of the decoding devices according to device embodiment 1, or device embodiment 2, or device embodiment 3, or device embodiment 4. This embodiment mainly describes how a final decoding result is acquired in a process in which a processing unit 204, a processing unit 404, a processing unit 604, and a processing unit 804 acquire a second code word by using method 1 and perform decision on the second code word. FIG. 10 shows a schematic flowchart of the decoding method. The method includes:

Step 1402: Acquire a code word processed by an LDPC code encoding device. In this method embodiment, for example, the acquired code word is −9, +7, 12, +4, +7, +10, −11, and the following check matrix is used. In practice, if one round or multiple rounds of updates are already performed on the code word before execution of step 1402, in step 1402, impact brought by a previous round of update on the code word further needs to be removed, that is, a previous round of update values are subtracted.

$$\begin{vmatrix} 1 & 1 & 0 & 1 & 0 & 0 & 0 \\ 0 & 0 & 1 & 1 & 1 & 0 & 0 \\ 0 & 0 & 0 & 1 & 0 & 1 & 1 \end{vmatrix}$$

Step 1404: Determine whether the code word −9, +7, −12, +4, +7, +10, −11 is decoded successfully. Negative values in code elements are mapped to 1 and positive values are mapped to 0 to obtain a mapped code word 1, 0, 1, 0, 0, 0, 1, and an exclusive OR operation, also referred to as a sum modulo 2 or an addition modulo 2 operation, is performed on each code element in the mapped code word according to a check equation. According to an operation on the $K^{th}$ row of the check matrix, $(1+0+0) \mod (2)=1$, and the code word fails to be decoded. If the decoding succeeds in step 1404, a decoding result is output.

Step 1406: Generate, according to code elements corresponding to the $K^{th}$ row of the check matrix, update values corresponding to the code elements corresponding to the $K^{th}$ row. That is, for the first code element −9, the second code element +7, and the fourth code element +4, update values corresponding to the three code elements are generated, namely, an update value +4 of the first code element, an update value −4 of the second code element, and an update value −7 of the fourth code element. Herein, K may start from 1.

After step 1406, either step 1408 or step 1410 may be performed.

Step 1408: Update, according to the update values of the code elements corresponding to the $K^{th}$ row of the check matrix, the code elements corresponding to the $K^{th}$ row of the check matrix; and, if an update value of any code element exceeds a code element quantization range, abandon an update of the code element. In this method embodiment, a code element quantization range is set to from −15 to +15, and the code word −9, +7, −12, +4, +7, +10, −11 is updated to a code word −5, +3, −12, −3, +7, +10, −11.

Step 1410: Update, according to the update values of the code elements corresponding to the $K^{th}$ row of the check matrix, the code elements corresponding to the $K^{th}$ row of the check matrix; and, if an update value of any code element exceeds a code element quantization range, abandon an update of all code elements corresponding to the $K^{th}$ row of the check matrix. Likewise, because no updated code element exceeds the code element quantization range, the code word −9, +7, −12, +4, +7, +10, −11 is updated to a code word −5, +3, −12, −3, +7, +10, −11.

Step 1412: Determine whether the code word updated in step 1408 or step 1410 is decoded successfully. If the decoding succeeds, a counter increases by 1 (each time the decoding device acquires a new to-be-decoded code word, an initial value of the counter is 0; or each time the decoding device finds that the code word obtained in step 1412 fails to be decoded, a value of the counter returns to 0); if the decoding fails, step 1402 to step 1412 are performed again on another row of the check matrix by using the updated code word as the code word acquired in step 1402.

Step 1414: Determine whether the counter reaches a preset threshold; if the preset threshold is not reached, perform step 1402 to step 1412 again on another row of the check matrix by using the updated code word as the code word acquired in step 1402; if the preset threshold is reached, use, as a decoding result of the code word, a result of mapping a finally acquired updated code word and output the decoding result.

It should be noted that step 1404 is not required in a subsequent update process, except in the first update process of a code word. After step 1402 is performed, step 1406 is directly performed.

According to the decoding method provided in this embodiment, processing is performed in a case that occurs in a code word update process of an LDPC code decoding process and in which a value of an updated code element exceeds a code element quantization range, which prevents direct quantization of an updated code word that exceeds the code element quantization range in the LDPC code decoding process, and improves an LDPC code error correction capability.

System Embodiment 1

This system embodiment provides a signal transmission system, including a decoding device, an LDPC encoding device, and a communications channel. The decoding device may be the decoding device 200 according to device embodiment 1 or the decoding device 600 according to device embodiment 3.

The LDPC code encoding device is configured to generate a first code word according to a generator matrix and transmit the first code word to the decoding device through the communications channel. For a subsequent process in which the decoding device processes the first code word, refer to implementation details of the decoding device 200 according to device embodiment 1 or implementation details of the decoding device 600 according to device embodiment 3.

This embodiment provides a signal transmission system. A decoding device in the signal transmission system performs processing in a case that occurs in a code word update process of an LDPC code decoding process and in which a value of an updated code element exceeds a code element quantization range, which prevents direct quantization of an updated code word that exceeds the code element quantization range in the LDPC code decoding process, improves a capability of correcting an error in an LDPC code transmitted in the signal transmission system, and also improves reliability of a signal transmitted in the signal transmission system.

System Embodiment 2

This system embodiment provides a signal transmission system, including a decoding device, an LDPC encoding device, and a communications channel. The decoding device may be the decoding device 400 according to device embodiment 2 or the decoding device 800 according to device embodiment 4.

The LDPC code encoding device is configured to generate a first code word according to a generator matrix and transmit the first code word to the decoding device through the communications channel. For a subsequent process in which the decoding device processes the first code word, refer to implementation details of the decoding device 400 according to device embodiment 2 or implementation details of the decoding device 800 according to device embodiment 4.

This embodiment provides a signal transmission system. A decoding device in the signal transmission system performs processing in a case that occurs in a code word update process of an LDPC code decoding process and in which a value of an updated code element exceeds a code element quantization range, which prevents direct quantization of an updated code word that exceeds the code element quantization range in the LDPC code decoding process, improves a capability of correcting an error in an LDPC code transmitted in the signal transmission system, and also improves reliability of a signal transmitted in the signal transmission system.

System Embodiment 3

This system embodiment provides a data storage system, including a decoding device, an LDPC encoding device, and a storage medium. The decoding device may be the decoding device 200 according to device embodiment 1 or the decoding device 600 according to device embodiment 3.

The LDPC code encoding device is configured to generate a first code word according to a generator matrix and store the first code word in the storage medium, and the decoding device is configured to acquire the first code word from the storage medium. For a subsequent process in which the decoding device processes the first code word, refer to implementation details of the decoding device 200 according to device embodiment 1 or implementation details of the decoding device 600 according to device embodiment 3.

This embodiment provides a data storage system. A decoding device in the data storage system performs processing in a case that occurs in a code word update process of an LDPC code decoding process and in which a value of an updated code element exceeds a code element quantization range, which prevents direct quantization of an updated code word that exceeds the code element quantization range in the LDPC code decoding process, improves an LDPC code error correction capability of the decoding device in the data storage system, and also improves reliability of data stored in the data storage system.

System Embodiment 4

This system embodiment provides a data storage system, including a decoding device, an LDPC encoding device, and a storage medium. The decoding device may be the decoding device 400 according to device embodiment 2 or the decoding device 800 according to device embodiment 4.

The LDPC code encoding device is configured to generate a first code word according to a generator matrix and store the first code word in the storage medium, and the decoding device is configured to acquire the first code word from the storage medium. For a subsequent process in which the decoding device processes the first code word, refer to implementation details of the decoding device 400 according to device embodiment 2 or implementation details of the decoding device 800 according to device embodiment 4.

This embodiment provides a data storage system. A decoding device in the data storage system performs processing in a case that occurs in a code word update process of an LDPC code decoding process and in which a value of an updated code element exceeds a code element quantization range, which prevents direct quantization of an updated code word that exceeds the code element quantization range in the LDPC code decoding process, improves an LDPC code error correction capability of the decoding device in the data storage system, and also improves reliability of data stored in the data storage system.

Figure 11:
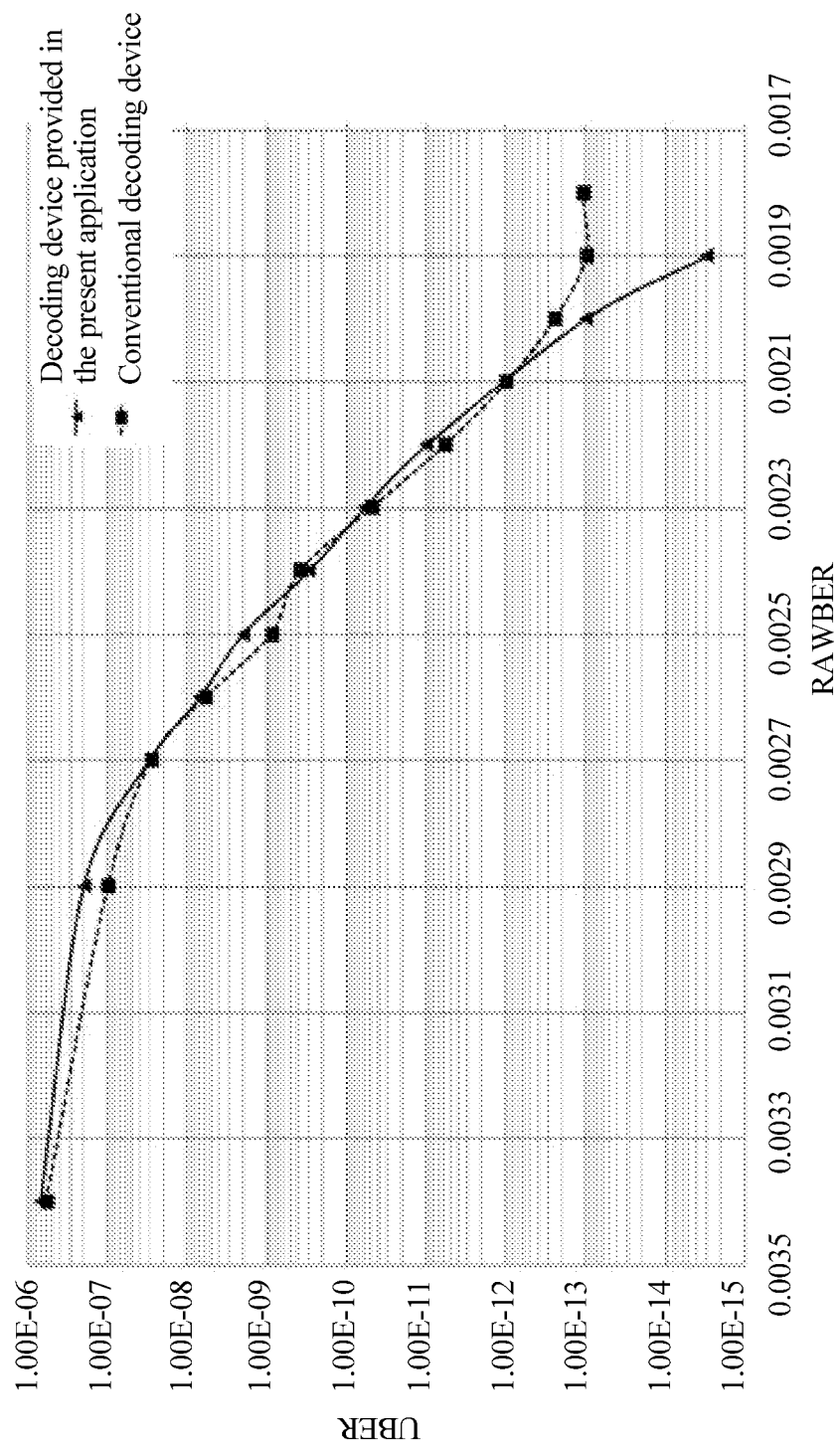
FIG. 11 is emulation results of a decoding device according to the present application and a conventional decoding device.

FIG. 11 is a comparison diagram of emulation results of a conventional decoding device and a decoding device proposed in the present application. Emulation is generating, based on an LDPC FPGA emulation platform, a random sequence (that is, the to-be-transmitted signal mentioned above) by using an FPGA, then performing LDPC encoding and modulation and adding random white Gaussian noise to generate a code word (that is, the first code word mentioned above), and finally performing LDPC decoding on the code word. The FPGA emulation platform completes statistics collection on RAWBER and UBER. A full name of UBER is Uncorrected Bit Error Rate, that is, a bit error rate that cannot be corrected. A full name of RAWBER is Raw Bit Error Rate, that is, a bit error rate of the code word generated by performing encoding and adding white noise. Therefore, a smaller value of the RAWBER indicates a lower bit error rate of the to-be-decoded code word itself in theory, and therefore, the UBER rate should also decrease accordingly. It can be seen from FIG. 11 that, in the conventional solution, when the RAWBER is less than 0.0021, the UBER no longer decreases accordingly and an LDPC code error correction capability reaches a bottleneck. However, when the LDPC code decoding device provided in the present application is used and the RAWER is less than 0.0021, the UBER still keeps decreasing accordingly, which breaks the performance bottleneck of the conventional LDPC code decoding device and effectively improves the LDPC code error correction capability.

In device embodiment 1, the processing unit 204 is configured to acquire P first code elements corresponding to the $n^{th}$ row of a check matrix; acquire P first update values corresponding to the P first code elements; obtain, according to the P first update values, P second update values corresponding to the P first code elements; determine whether each second update value of the P second update values exceeds a code element quantization range; keep the $a^{th}$ first code element not updated when the $a^{th}$ second update value of the P second update values exceeds the code element quantization range; update the $b^{th}$ first code element by using the $b^{th}$ second update value when the $b^{th}$ second update value of the P second update values does not exceed the code element quantization range; obtain, according to the foregoing update operation, P second code elements corresponding to the $n^{th}$ row of the check matrix; and generate a second code word according to the P second code elements corresponding to the $n^{th}$ row of the check matrix, where the check matrix corresponds to the generator matrix and includes N rows, $1 \le n \le N$, $P \le M$, $1 \le a \le P$, $1 \le b \le P$, and each second update value is a sum of each first update value and a corresponding first code element.

Optionally, the determining whether each second update value of the P second update values exceeds a code element quantization range may be concurrently determining whether each second update value of the P second update values exceeds the code element quantization range, that is, after acquiring each second update value of the P second update values, the processing unit 204 concurrently determines whether the P second update values exceed the code element quantization range; or may be sequentially determining, from left to right according to a sequence of the P code elements corresponding to the $n^{th}$ row of the check matrix, whether each second update value of the P second update values exceeds the code element quantization range.

Optionally, the acquiring unit 202, the processing unit 204, and the determining unit 206 that are included in the decoding device 200 each are implemented by using a circuit.

After acquiring the second update values, the processing unit 204 determines whether each second update value exceeds the code element quantization range; if the processing unit 204 determines that the $a^{th}$ second update value exceeds the code element quantization range, the processing unit 204 does not update the $a^{th}$ first code element by using the $a^{th}$ second update value, that is, keeps the $a^{th}$ first code element not updated; if the processing unit 204 determines that the $b^{th}$ second update value does not exceed the code element quantization range, the processing unit 204 updates the $b^{th}$ first code element by using the $b^{th}$ second update value.

According to the example in device embodiment 1, because P is equal to 3 in this example, a value of a may be 1, 2, or 3 and corresponds to a second update value −5, +3, or −3, respectively. For example, a is set to 1; the processing unit 204 determines whether the second update value −5 exceeds the code element quantization range; if the second update value −5 exceeds the code element quantization range, −9 is not updated by using −5, that is, the code element −9 keeps unchanged; if the second update value −5 does not exceed the code element quantization range, −9 is updated by using −5, that is, the code element −9 is updated to −5. The processing unit 204 may concurrently determine whether the second update values −5, +3, and −3 exceed the code element quantization range, or may determine whether the second update values −5, +3, and −3 exceed the code element quantization range according to a sequence of first code elements corresponding to a bit 1 on the first row of the check matrix, that is, first −5, then +3, and then −3.

In device embodiment 2, the processing unit 404 is configured to acquire P first code elements corresponding to the $n^{th}$ row of a check matrix; acquire P first update values corresponding to the P first code elements; obtain, according to the P first update values, P second update values corresponding to the P first code elements; determine whether each second update value of the P second update values exceeds a code element quantization range; keep the P first code elements not updated when the $a^{th}$ second update value of the P second update values exceeds the code element quantization range; update the P first code elements by using the P second update values when each second update value of the P second update values does not exceed the code element quantization range; obtain, according to the foregoing update operation, P second code elements corresponding to the $n^{th}$ row of the check matrix; and generate a second code word according to the P second code elements, where the check matrix corresponds to the generator matrix and includes N rows, $1 \le n \le N$, $P \le M$, $1 \le a \le P$, $1 \le b \le P$, and each second update value is a sum of each first update value and a corresponding first code element.

Optionally, the determining whether each second update value of the P second update values exceeds a code element quantization range may be concurrently determining whether each second update value of the P second update values exceeds the code element quantization range, that is, after acquiring each second update value of the P second update values, the processing unit 404 concurrently determines whether the P second update values exceed the code element quantization range; or may be sequentially determining, from left to right according to a sequence of the P code elements corresponding to the $n^{th}$ row of the check matrix, whether each second update value of the P second update values exceeds the code element quantization range.

Optionally, the acquiring unit 402, the processing unit 404, and the determining unit 406 that are included in the decoding device 400 each are implemented by using a circuit.

After acquiring the second update values, the processing unit 404 determines whether each second update value exceeds a code element quantization range; if the processing unit 404 determines that the $a^{th}$ second update value exceeds the code element quantization range, the processing unit 404 does not update the P first code elements by using the P second update values, that is, keeps the P first code elements not updated; if the processing unit 404 determines that each second update value of the P second update values does not exceed the code element quantization range, the processing unit 404 updates the P first code elements by using the P second update values.

According to the example in device embodiment 1, because P is equal to 3 in this example, a value of a may be 1, 2, or 3 and corresponds to a second update value −5, +3, or −3, respectively. For example, a is set to 1; the processing unit 404 determines whether the second update value −5 exceeds the code element quantization range; if the second update value −5 exceeds the code element quantization range, −9 is not updated by using −5, −4 is not updated by using +3, and −7 is not updated by using −3; similarly, if another second update value exceeds the code element quantization range, updating the first code elements by using any one of the second update values is abandoned; if none of the second update values −5, +3, and −3 exceeds the code element quantization range, −9 is updated by using −5, −4 is updated by using +3, and −7 is updated by using −3. The processing unit 404 may concurrently determine whether the second update values −5, +3, and −3 exceed the code element quantization range, or may determine second update values −5, +3, and −3 according to a sequence of first code elements corresponding to a bit 1 on the first row of the check matrix, that is, first −5, then +3, and then −3, and if any one of the first code elements exceeds the code element quantization range, determining is not required for remaining first code elements.

In device embodiment 3, the variable node processing unit 6042 is implemented by using a circuit, and the check node processing unit 6044 is implemented by using a circuit.

In device embodiment 4, the variable node processing unit 8042 is implemented by using a circuit, and the check node processing unit 8044 is implemented by using a circuit.

In method embodiment 1, step 1004: acquire P first code elements corresponding to the $n^{th}$ row of a check matrix; acquire P first update values corresponding to the P first code elements; obtain, according to the P first update values, P second update values corresponding to the P first code elements; determine whether each second update value of the P second update values exceeds a code element quantization range; keep the $a^{th}$ first code element not updated when the $a^{th}$ second update value of the P second update values exceeds the code element quantization range; update the $b^{th}$ first code element by using the $b^{th}$ second update value when the $b^{th}$ second update value of the P second update values does not exceed the code element quantization range; obtain, according to the foregoing update operation, P second code elements corresponding to the $n^{th}$ row of the check matrix; and generate a second code word according to the P second code elements, where the check matrix corresponds to the generator matrix and includes N rows, 1≤n≤N, P≤M, 1≤a≤P, 1≤b≤P, and each second update value is a sum of each first update value and a corresponding first code element. For details about execution of step 1004, refer to the processing unit 204 in device embodiment 1, or the processing unit 604 and all subunits of the processing unit 604 in device embodiment 3.

Optionally, the determining whether each second update value of the P second update values exceeds a code element quantization range may be concurrently determining whether each second update value of the P second update values exceeds the code element quantization range, that is, after acquiring each second update value of the P second update values, concurrently determining whether the P second update values exceed the code element quantization range; or may be sequentially determining, from left to right according to a sequence of the P code elements corresponding to the $n^{th}$ row of the check matrix, whether each second update value of the P second update values exceeds the code element quantization range.

In method embodiment 2, step 1204: acquire P first code elements corresponding to the $n^{th}$ row of a check matrix; acquire P first update values corresponding to the P first code elements; obtain, according to the P first update values, P second update values corresponding to the P first code elements; determine whether each second update value of the P second update values exceeds a code element quantization range; keep the P first code elements not updated when the $a^{th}$ second update value of the P second update values exceeds the code element quantization range; update the P first code elements by using the P second update values when each second update value of the P second update values does not exceed the code element quantization range; obtain, according to the foregoing update operation, P second code elements corresponding to the $n^{th}$ row of the check matrix; and generate a second code word according to the P second code elements, where the check matrix corresponds to the generator matrix and includes N rows, 1≤n≤N, P≤M, 1≤a≤P, 1≤b≤P, and each second update value is a sum of each first update value and a corresponding first code element. For details about execution of step 1204, refer to the processing unit 404 in device embodiment 2, or the processing unit 804 and all subunits of the processing unit 804 in device embodiment 4.

Optionally, the determining whether each second update value of the P second update values exceeds a code element quantization range may be concurrently determining whether each second update value of the P second update values exceeds the code element quantization range, that is, after acquiring each second update value of the P second update values, concurrently determining whether the P second update values exceed the code element quantization range; or may be sequentially determining, from left to right according to a sequence of the P code elements corresponding to the $n^{th}$ row of the check matrix, whether each second update value of the P second update values exceeds the code element quantization range.

For parts without detailed description in an embodiment of the present application, refer to related description of another embodiment. Finally, it should be noted that the foregoing embodiments are merely intended for describing the technical solutions of the present application, but not for limiting the present application. Although the present application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present application.

What is claimed is:

1. A decoding device, comprising:
   at least one processor, and a non-transitory medium storing instruction for execution by the at least one processor;
   wherein, by executing the instructions, the decoding device is configured to:
   receive a second code word, wherein the second code word is transmitted from an encoding device based on a first code word, and the first code word is generated by the encoding device based on a first encoded data sequence, wherein the first encoded data sequence is generated according to to-be-transmitted data using a generator matrix, wherein the generator matrix corresponds to a check matrix prestored in the decoding device, wherein the second code word comprises M code elements, and the check matrix comprises M columns and N rows, M and N are positive integers;

determine whether a second encoded data sequence corresponding to the second code word is a correct replica of the first encoded data sequence;

based on a determination that the second encoded data sequence is not a correct replica of the first encoded data sequence, perform a code element update process to obtain a third code word; and determine whether a third encoded data sequence corresponding to the third code word is a correct replica of the first encoded data sequence;

wherein the code element update process comprises:

corresponding to each non-zero element in an $n^{th}$ row of the check matrix, obtaining a code element $E_{n,m}$ from the second code word, where $1 \leq n \leq N$, $1 \leq m \leq M$, wherein $E_{n,m}$ represents the $m^{th}$ code element of the second code word;

for each $E_{n,m}$, obtaining a first update value $E'_{n,m}$ and a second update value $E''_{n,m}$, wherein the $E''_{n,m}$ is a sum of the $E_{n,m}$ and the $E'_{n,m}$;

for each $E_{n,m}$, determining whether the $E''_{n,m}$ exceeds a code element quantization range;

when the $E''_{n,m}$ exceeds the code element quantization range, keeping the $E_{n,m}$ not updated; or when the $E''_{n,m}$ does not exceed the code element quantization range, updating the $E_{n,m}$ with the $E''_{n,m}$; and obtaining the third code word based on the second code word and update results of the $E_{n,m}$.

2. The decoding device according to claim 1, wherein in determining whether each of the $E''_{n,m}$ exceeds a code element quantization range, the decoding device is configured to:

sequentially determine whether each of the $E''_{n,m}$ exceeds the code element quantization range.

3. The decoding device according to claim 1, further comprising a storage unit configured to store the check matrix, the second code word, the code elements $E_{n,m}$, the first update values $E'_{n,m}$ and the second update values $E''_{n,m}$.

4. The decoding device according to claim 1, wherein in determining whether the second encoded data sequence corresponding to the second code word is a correct replica of the first encoded data sequence, the decoding device is configured to:

perform an exclusive OR operation to data bits of the second encoded data sequence corresponding to each non-zero element in the $n^{th}$ row of the check matrix; and determine whether the second encoded data sequence corresponding to the second code word is a correct replica of the first encoded data sequence according to a result of the exclusive OR operation.

5. The decoding device according to claim 1, wherein, by executing the instructions, the decoding device is further configured to:

based on a determination that the third encoded data sequence is not a correct replica of the first encoded data sequence, perform the code element update process again using a different row of the check matrix to obtain a fourth code word; and determine whether a fourth encoded data sequence corresponding to the fourth code word is a correct replica of the first encoded data sequence.

6. A decoding device, comprising:

at least one processor, and a non-transitory medium storing instruction for execution by the at least one processor;

wherein, by executing the instructions, the decoding device is configured to:

receive a second code word, wherein the second code word is transmitted from an encoding device based on a first code word, and the first code word is generated by the encoding device based on a first encoded data sequence, wherein the first encoded data sequence is generated according to to-be-transmitted data using a generator matrix, wherein the generator matrix corresponds to a check matrix prestored in the decoding device, wherein the second code word comprises M code elements, and the check matrix comprises M columns and N rows, M and N are positive integers;

determine whether a second encoded data sequence corresponding to the second code word is a correct replica of the first encoded data sequence;

based on a determination that the second encoded data sequence is not a correct replica of the first encoded data sequence, perform a code element update process to obtain a third code word; and determine whether a third encoded data sequence corresponding to the third code word is a correct replica of the first encoded data sequence;

wherein the code element update process comprises:

corresponding to each non-zero element in an $n^{th}$ row of the check matrix, obtaining a code element $E_{n,m}$ from the second code word, where $1 \leq n \leq N$, $1 \leq m \leq M$, wherein $E_{n,m}$ represents the $m^{th}$ code element of the second code word;

for each $E_{n,m}$, obtaining a first update value $E'_{n,m}$ and a second update value $E''_{n,m}$, wherein the $E''_{n,m}$ is a sum of the $E_{n,m}$ and the $E'_{n,m}$;

for each $E_{n,m}$, determining whether the $E''_{n,m}$ exceeds a code element quantization range;

when one of the $E''_{n,m}$ exceeds the code element quantization range, keeping all code elements $E_{n,m}$ not updated; or when all the $E''_{n,m}$ do not exceed the code element quantization range, updating the $E_{n,m}$ with the $E''_{n,m}$; and obtaining the third code word based on the second code word and update results of the $E_{n,m}$.

7. The decoding device according to claim 6, wherein in determining whether each of the $E''_{n,m}$ exceeds a code element quantization range, the decoding device is configured to:

sequentially determine whether each of the $E''_{n,m}$ exceeds the code element quantization range.

8. The decoding device according to claim 6, further comprising a storage unit configured to store the check matrix, the second code word, the code elements $E_{n,m}$, the first update values $E'_{n,m}$ and the second update values $E''_{n,m}$.

9. The decoding device according to claim 6, wherein in determining whether the second encoded data sequence corresponding to the second code word is a correct replica of the first encoded data sequence, the decoding device is configured to:

perform an exclusive OR operation to data bits of the second encoded data sequence corresponding to each non-zero element in the $n^{th}$ row of the check matrix; and determine whether the second encoded data sequence corresponding to the second code word is a correct replica of the first encoded data sequence according to a result of the exclusive OR operation.

10. The decoding device according to claim 6, wherein, by executing the instructions, the decoding device is further configured to:
based on a determination that the third encoded data sequence is not a correct replica of the first encoded data sequence, perform the code element update process again using a different row of the check matrix to obtain a fourth code word; and
determine whether a fourth encoded data sequence corresponding to the fourth code word is a correct replica of the first encoded data sequence.

11. A decoding method, comprising:
receiving, by a decoding device, a second code word, wherein the second code word is transmitted from an encoding device based on a first code word, and the first code word is generated by the encoding device based on a first encoded data sequence, wherein the first encoded data sequence is generated according to to-be-transmitted data using a generator matrix, wherein the generator matrix corresponds to a check matrix pre-stored in the decoding device, wherein the second code word comprises M code elements, and the check matrix comprises M columns and N rows, M and N are positive integers;
determining, by the decoding device, whether a second encoded data sequence corresponding to the second code word is a correct replica of the first encoded data sequence;
based on a determination that the second encoded data sequence is not a correct replica of the first encoded data sequence, performing, by the decoding device, a code element update process to obtain a third code word; and
determining, by the decoding device, whether a third encoded data sequence corresponding to the third code word is a correct replica of the first encoded data sequence;
wherein the code element update process comprises:
corresponding to each non-zero element in an $n^{th}$ row of the check matrix, obtaining a code element $E_{n,m}$ from the second code word, where 1≤n≤N, 1≤m≤M, wherein $E_{n,m}$ represents the $m^{th}$ code element of the second code word;
for each $E_{n,m}$, obtaining a first update value $E'_{n,m}$ and a second update value $E''_{n,m}$, wherein the $E''_{n,m}$ is a sum of the $E_{n,m}$ and the $E'_{n,m}$;
for each $E_{n,m}$, determining whether the $E''_{n,m}$ exceeds a code element quantization range;
when the $E''_{n,m}$ exceeds the code element quantization range, keeping the $E_{n,m}$ not updated; or
when the $E''_{n,m}$ does not exceed the code element quantization range, updating the $E_{n,m}$ with the $E''_{n,m}$; and
obtaining the third code word based on the second code word and update results of the $E_{n,m}$.

12. The decoding method according to claim 11, wherein determining whether each of the $E''_{n,m}$ exceeds a code element quantization range comprises:
sequentially determining, by the decoding device, whether each of the $E''_{n,m}$ exceeds the code element quantization range.

13. The decoding method according to claim 11, wherein determining whether a second encoded data sequence corresponding to the second code word is a correct replica of the first encoded data sequence comprises:
performing, by the decoding device, an exclusive OR operation to data bits of the second encoded data sequence corresponding to each non-zero element in the $n^{th}$ row of the check matrix; and
determining, by the decoding device, whether the second encoded data sequence corresponding to the second code word is a correct replica of the first encoded data sequence according to a result of the exclusive OR operation.

14. The decoding method according to claim 11, further comprising:
based on a determination that the third encoded data sequence is not a correct replica of the first encoded data sequence, performing, by the decoding device, the code element update process again using a different row of the check matrix to obtain a fourth code word; and
determining, by the decoding device, whether a fourth encoded data sequence corresponding to the fourth code word is a correct replica of the first encoded data sequence.

15. A decoding method, comprising:
receiving, by a decoding device, a second code word, wherein the second code word is transmitted from an encoding device based on a first code word, and the first code word is generated by the encoding device based on a first encoded data sequence, wherein the first encoded data sequence is generated according to to-be-transmitted data using a generator matrix, wherein the generator matrix corresponds to a check matrix pre-stored in the decoding device, wherein the second code word comprises M code elements, and the check matrix comprises M columns and N rows, M and N are positive integers;
determining, by the decoding device, whether a second encoded data sequence corresponding to the second code word is a correct replica of the first encoded data sequence;
based on a determination that the second encoded data sequence is not a correct replica of the first encoded data sequence, performing, by the decoding device, a code element update process to obtain a third code word; and
determining, by the decoding device, whether a third encoded data sequence corresponding to the third code word is a correct replica of the first encoded data sequence;
wherein the code element update process comprises:
corresponding to each non-zero element in an $n^{th}$ row of the check matrix, obtaining a code element $E_{n,m}$ from the second code word, where 1≤n≤N, 1≤m≤M, wherein $E_{n,m}$ represents the $m^{th}$ code element of the second code word;
for each $E_{n,m}$, obtaining a first update value $E'_{n,m}$ and a second update value $E''_{n,m}$, wherein the $E''_{n,m}$ is a sum of the $E_{n,m}$ and the $E'_{n,m}$;
for each $E_{n,m}$, determining whether the updated value $E''_{n,m}$ exceeds a code element quantization range;
when one of the $E''_{n,m}$ exceeds the code element quantization range, keeping all code elements $E_{n,m}$ not updated; or
when all the $E''_{n,m}$ do not exceed the code element quantization range, updating the $E_{n,m}$ with the $E''_{n,m}$; and
obtaining the third code word based on the second code word and update results of the $E_{n,m}$.

16. The decoding method according to claim 15, wherein determining whether each of the $E''_{n,m}$ exceeds a code element quantization range comprises:

sequentially determining, by the decoding device, whether each of the $E''_{n,m}$ exceeds the code element quantization range.

17. The decoding method according to claim 15, wherein determining whether the second encoded data sequence corresponding to the second code word is a correct replica of the first encoded data sequence comprises:
- performing, by the decoding device, an exclusive OR operation to data bits of the second encoded data sequence corresponding to each non-zero element in the $n^{th}$ row of the check matrix; and
- determining, by the decoding device, whether the second encoded data sequence corresponding to the second code word is a correct replica of the first encoded data sequence according to a result of the exclusive OR operation.

18. The decoding method according to claim 15, further comprising:
- based on a determination that the third encoded data sequence is not a correct replica of the first encoded data sequence, performing, by the decoding device, the code element update process again using a different row of the check matrix to obtain a fourth code word; and
- determining, by the decoding device, whether a fourth encoded data sequence corresponding to the fourth code word is a correct replica of the first encoded data sequence.

* * * * *

UNITED STATES PATENT AND TRADEMARK OFFICE
CERTIFICATE OF CORRECTION

PATENT NO. : 10,447,300 B2
APPLICATION NO. : 15/951182
DATED : October 15, 2019
INVENTOR(S) : Zeng et al.

It is certified that error appears in the above-identified patent and that said Letters Patent is hereby corrected as shown below:

On the Title Page

Item (73), in Column 1, in "Assignee", Line 1, delete "HAUWEI" and insert -- HUAWEI --, therefor.

On Page 2, Item (56), in Column 2, under "OTHER PUBLICATIONS", Line 11, delete "LDPCDecoder" and insert -- LDPC Decoder --, therefor.

On Page 2, Item (56), in Column 2, under "OTHER PUBLICATIONS", Line 18, delete "anaylsis" and insert -- analysis --, therefor.

In the Specification

In Column 7, Line 27, delete "schemetic" and insert -- schematic --, therefor.

In Column 7, Line 30, delete "schemetic" and insert -- schematic --, therefor.

Signed and Sealed this
Eleventh Day of October, 2022

Katherine Kelly Vidal
*Director of the United States Patent and Trademark Office*